(12) United States Patent
Meyyappan et al.

(10) Patent No.: US 12,494,435 B2
(45) Date of Patent: Dec. 9, 2025

(54) LIQUID METAL INTERCONNECT FOR MODULAR SYSTEM ON AN INTERPOSER SERVER ARCHITECTURE

(71) Applicant: Intel Corporation, Santa Clara, CA (US)

(72) Inventors: Karumbu Meyyappan, Portland, OR (US); Jeffory L. Smalley, East Olympia, WA (US); Gregorio Murtagian, Phoenix, AZ (US); Srikant Nekkanty, Chandler, AZ (US); Pooya Tadayon, Portland, OR (US); Eric J.M. Moret, Beaverton, OR (US); Bijoyraj Sahu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 840 days.

(21) Appl. No.: 17/559,431

(22) Filed: Dec. 22, 2021

(65) Prior Publication Data
US 2023/0197622 A1 Jun. 22, 2023

(51) Int. Cl.
*H01L 23/538* (2006.01)
*H01L 23/498* (2006.01)
(Continued)

(52) U.S. Cl.
CPC .... *H01L 23/5384* (2013.01); *H01L 23/49827* (2013.01); *H01L 23/5385* (2013.01);
(Continued)

(58) Field of Classification Search
CPC .......... H01L 23/5384; H01L 23/49827; H01L 23/5385; H01L 23/367; H01L 23/49811;
(Continued)

(56) References Cited

U.S. PATENT DOCUMENTS 5,808,874 A * 9/1998 Smith ................... H01L 21/563
361/779
7,939,945 B2 * 5/2011 Sauciuc ............... H05K 3/3463
257/E21.597
(Continued)

FOREIGN PATENT DOCUMENTS

EP 3309829 4/2018

OTHER PUBLICATIONS

Extended European Search Report from European Patent Application No. 22214367.9 notified May 19, 2023, 6 pgs.

*Primary Examiner* — Dao H Nguyen
(74) *Attorney, Agent, or Firm* — Essential Patents Group, LLP

(57) ABSTRACT

An electronic system and associated methods are disclosed. In one example, the electronic system includes an interposer including electrically conductive interposer interconnect, a first interposer surface, and a second interposer surface; a processor package including at least one processor integrated circuit (IC), the processor package attached to the first interposer surface and electrically connected to the interposer interconnect; a first liquid metal well array including multiple liquid metal wells attached to a second interposer surface and the interposer interconnect; a second liquid metal well array including a first array surface attached to the first interposer surface and the interposer interconnect; and a packaged companion IC to the processor IC attached to a second array surface of the second liquid metal well array.

22 Claims, 25 Drawing Sheets

(51) Int. Cl.
    *H01L 25/00* (2006.01)
    *H01L 25/065* (2023.01)
    *H01L 25/18* (2023.01)
    *H01R 12/52* (2011.01)
    *H01R 12/58* (2011.01)
    *H05K 1/18* (2006.01)
    *H05K 3/32* (2006.01)

(52) U.S. Cl.
    CPC .......... *H01L 25/0655* (2013.01); *H01L 25/18* (2013.01); *H01L 25/50* (2013.01); *H01R 12/52* (2013.01); *H01R 12/58* (2013.01); *H05K 1/181* (2013.01); *H05K 3/32* (2013.01); *H05K 2201/10189* (2013.01); *H05K 2201/10378* (2013.01); *H05K 2201/10515* (2013.01); *H05K 2201/1053* (2013.01)

(58) Field of Classification Search
    CPC ............. H01L 23/498; H01L 23/49866; H01L 25/0655; H01L 25/18; H01L 25/50; H01L 25/0652; H10R 12/58; H05K 1/181; H05K 3/32; H05K 2201/10515; H05K 2201/1053

See application file for complete search history.

(56) References Cited

U.S. PATENT DOCUMENTS

| | | | |
|---|---|---|---|
| 8,901,748 B2* | 12/2014 | Manusharow | H01L 23/5385 257/652 |
| 10,624,206 B2* | 4/2020 | Sugaya | H05K 3/4038 |
| 10,727,185 B2* | 7/2020 | Aleksov | H01L 23/5386 |
| 10,998,291 B2* | 5/2021 | Keeth | G11C 8/12 |
| 2009/0001576 A1* | 1/2009 | Tuli | H01L 23/49827 257/E23.141 |
| 2014/0354318 A1* | 12/2014 | Oh | G01R 1/06783 29/829 |
| 2015/0270209 A1* | 9/2015 | Woychik | H01L 21/565 257/774 |
| 2016/0056102 A1* | 2/2016 | Konchady | H01L 23/5383 174/263 |
| 2017/0162550 A1* | 6/2017 | Das | H10D 86/0214 |
| 2020/0395309 A1* | 12/2020 | Cheah | H01L 25/0655 |

* cited by examiner

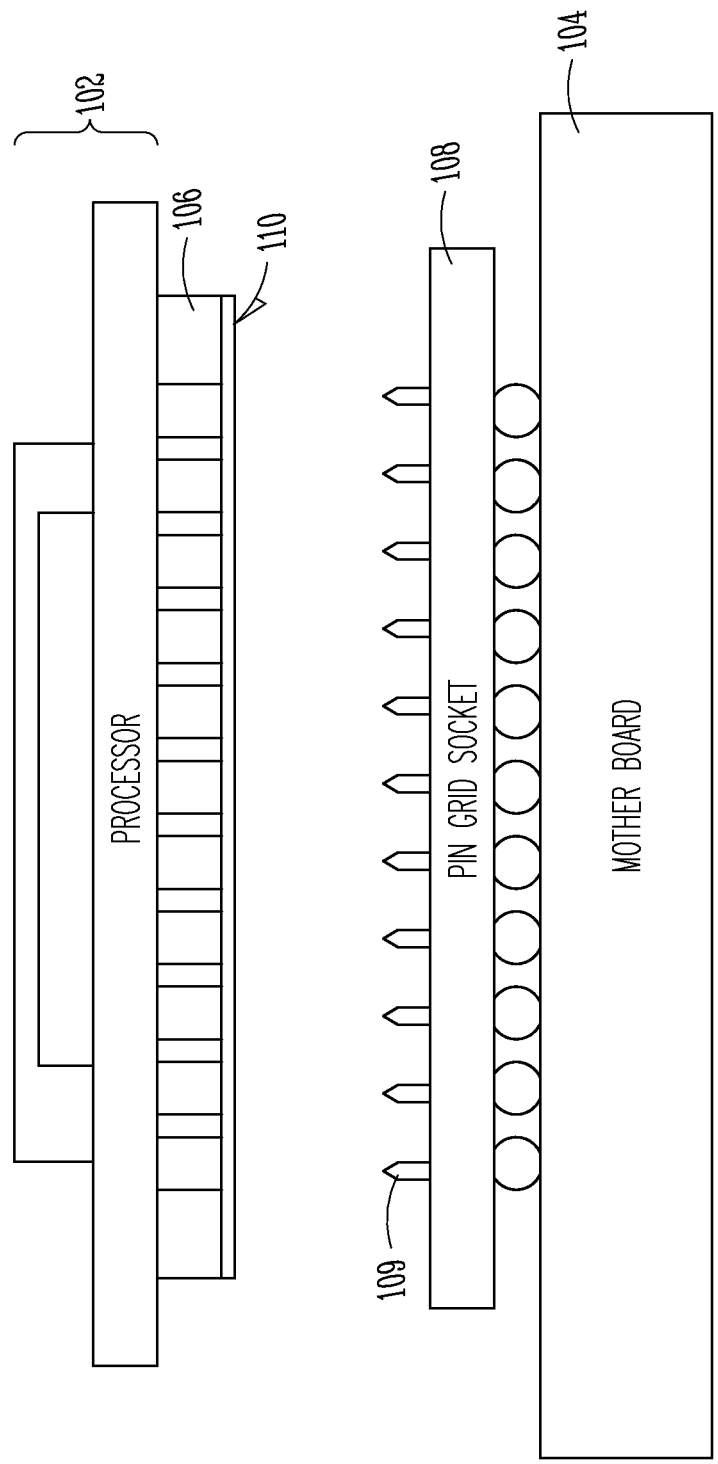

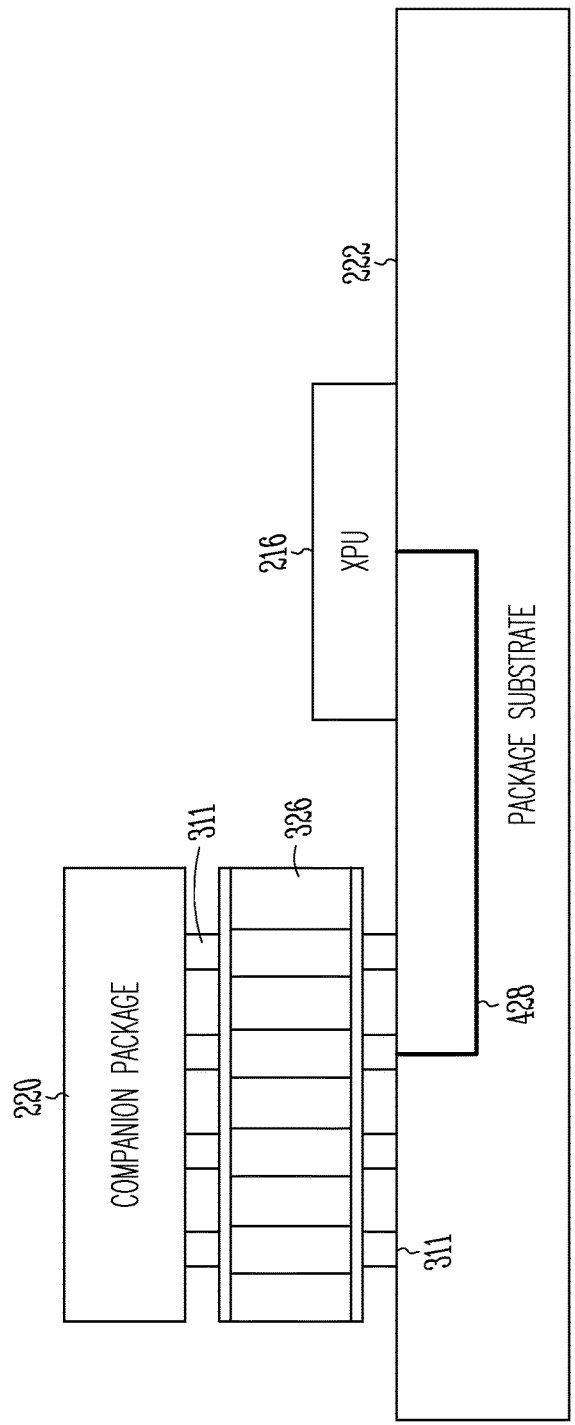
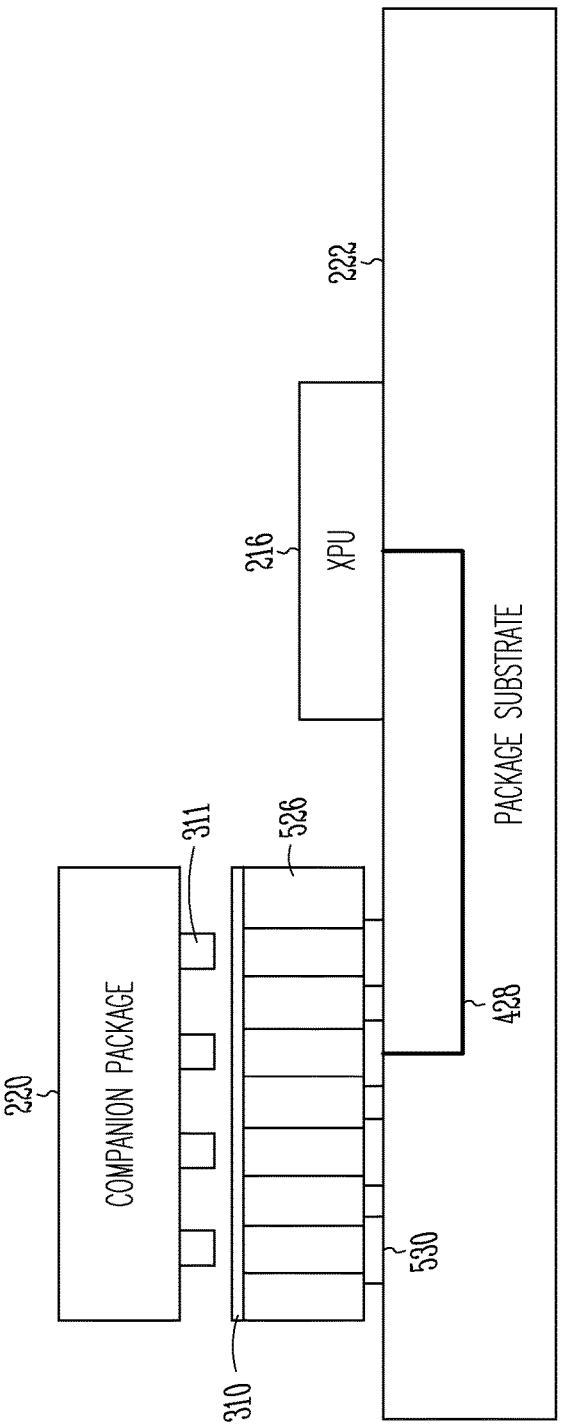

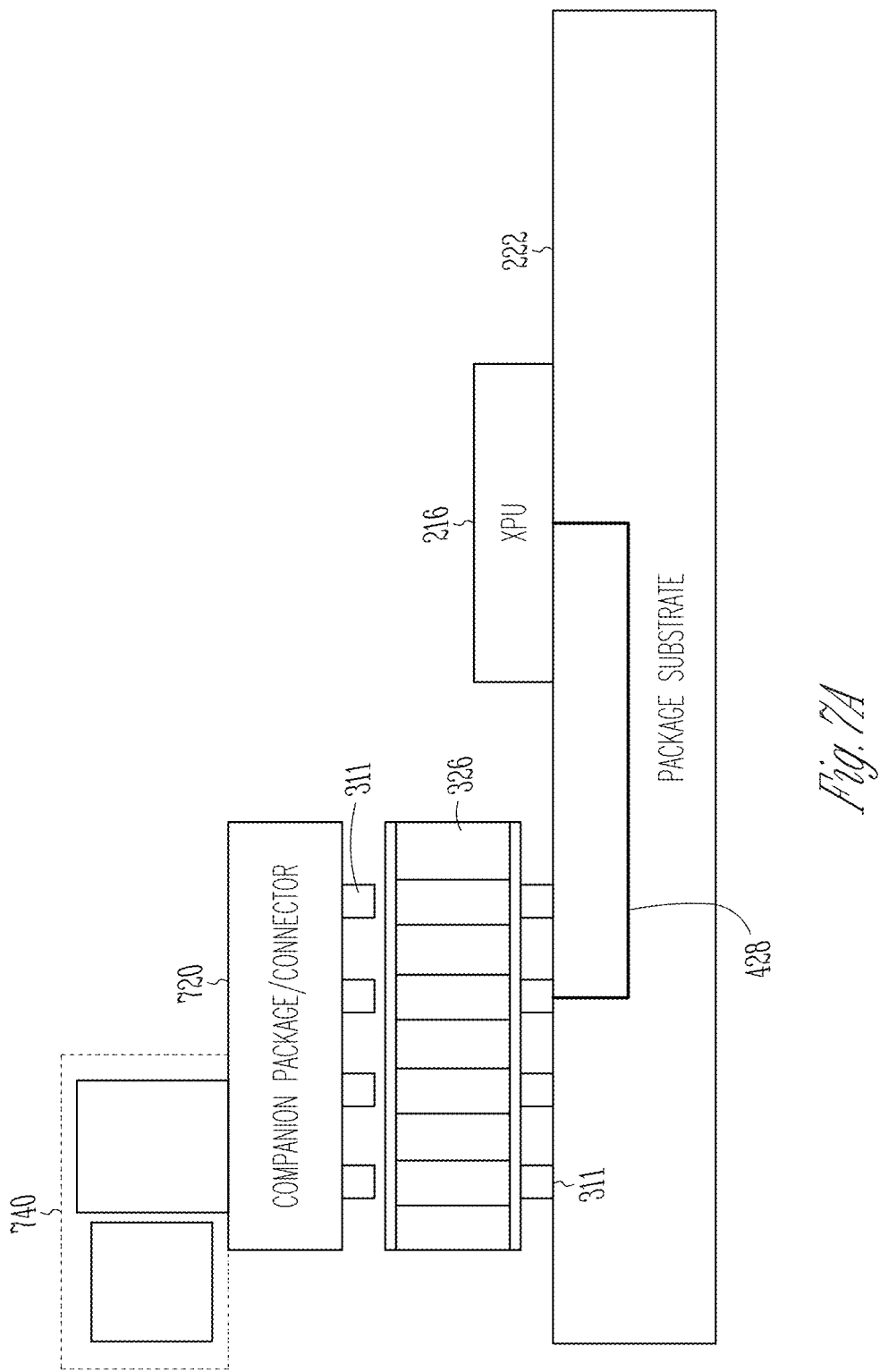

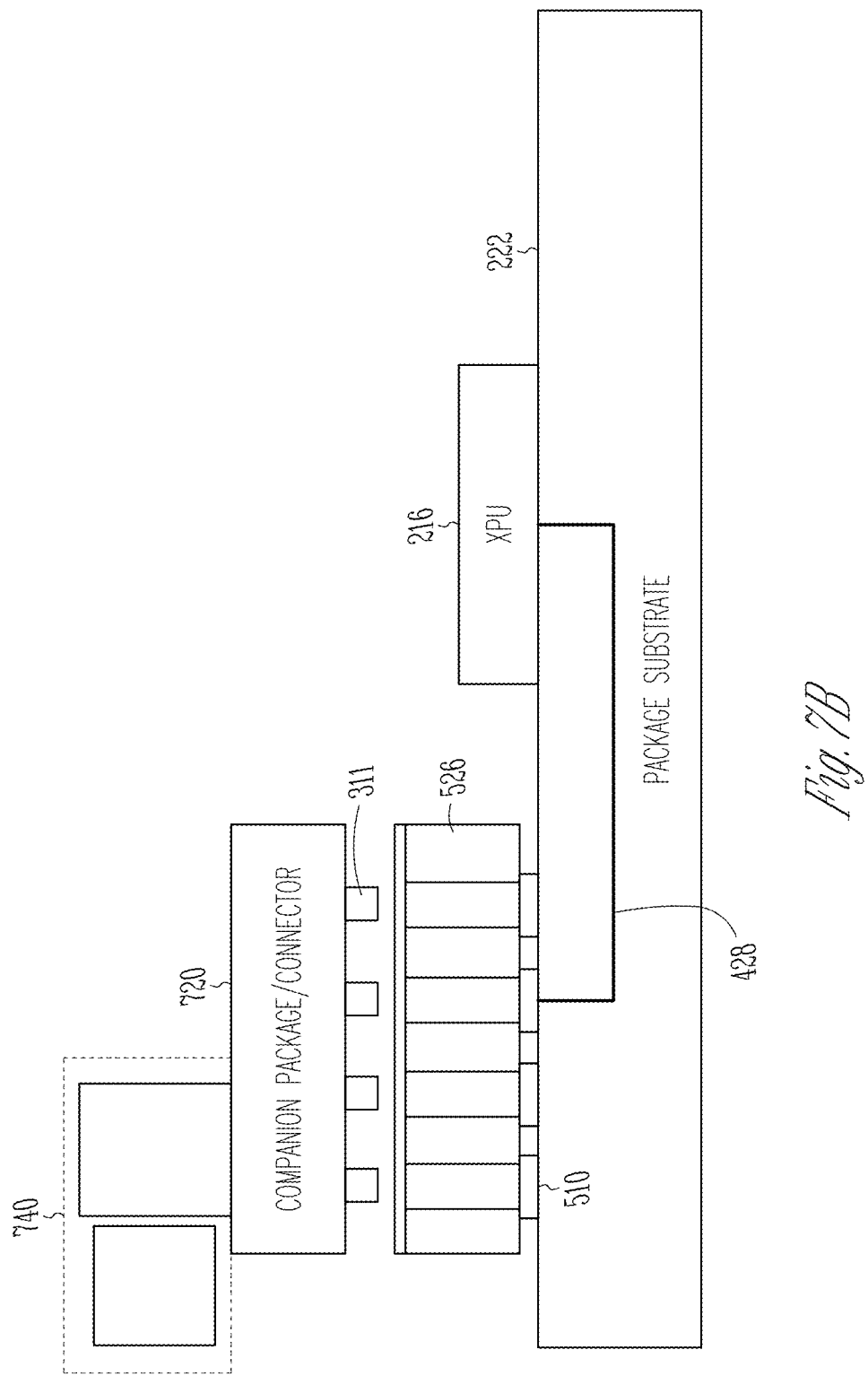

LIQUID METAL INTERCONNECT FOR MODULAR SYSTEM ON AN INTERPOSER SERVER ARCHITECTURE

TECHNICAL FIELD

Embodiments described herein generally relate to packaging of integrated circuits (ICs). Some embodiments relate to interconnection of ICs using liquid metal structures.

BACKGROUND

Traditional server and package architecture innovation has been constrained due mostly to the challenge of interconnecting the processing unit (e.g., an XPU such as a central processing unit (CPU), graphics processing unknit (GPU), infrastructure processing unit (IPU), etc.) and the rest of the server system. The desire for high-density interconnect has led to interconnect types (e.g., a land grid array (LGA) socket) that typically take sustained mechanical loading force to maintain the electrical connection between the CPU and the baseboard (e.g., a mother board). This force is directly proportional to the number of connections needed. As the number of connections grows larger, the area consumed by the components on the baseboard increases and the area dedicated to mechanical loading increases significantly to maintain the load without excessive flexure of the baseboard. Currently, server interconnects can range between 4000 and 6000 connections requiring between 300 pound-force (300 lbf) and 600 lbf to maintain electrical pathways that can use between 15 and 20 square inches of baseboard space. This greatly limits co-location of components directly on the baseboard, which limits architecture schemes that could provide substantial gains in performance. One approach to address the interconnect issue is to increase functionality to the processor package so that signals/functions stay within the processor package and the number of interconnections to the processor package is reduced.

However, increasing functionality of the processor package by directly integrating more components into the processor package results in similar challenges as the physical size of the processor package is increased to accommodate the additional dies. This results in growth of the mechanical loading hardware to avoid the larger processor packages, driving increased spans and larger keep out zones for the mechanical loading. To minimize this impact the features are placed in very close proximity with a very compact/dense permanent interconnects. As a consequence, the overall yield loss of the processor package increases with increasing complexity, driving up the overall processor manufacturing costs. It is desired to have an IC package solution that addresses these concerns and other technical challenges.

BRIEF DESCRIPTION OF THE DRAWINGS

FIGS. 1A and 1B are illustrations of examples of a liquid metal interconnect (LMI) between a processor package and a mother board in accordance with some example embodiments.

FIG. 4 is an illustration of a side view of another example of a liquid metal interconnect approach in accordance with some example embodiments.

FIG. 5 is an illustration of a side view of another example of a liquid metal interconnect approach in accordance with some example embodiments.

FIGS. 7A-7B illustrate another example of a liquid metal interconnect approach in accordance with some example embodiments.

DESCRIPTION OF EMBODIMENTS

Figure 1B:
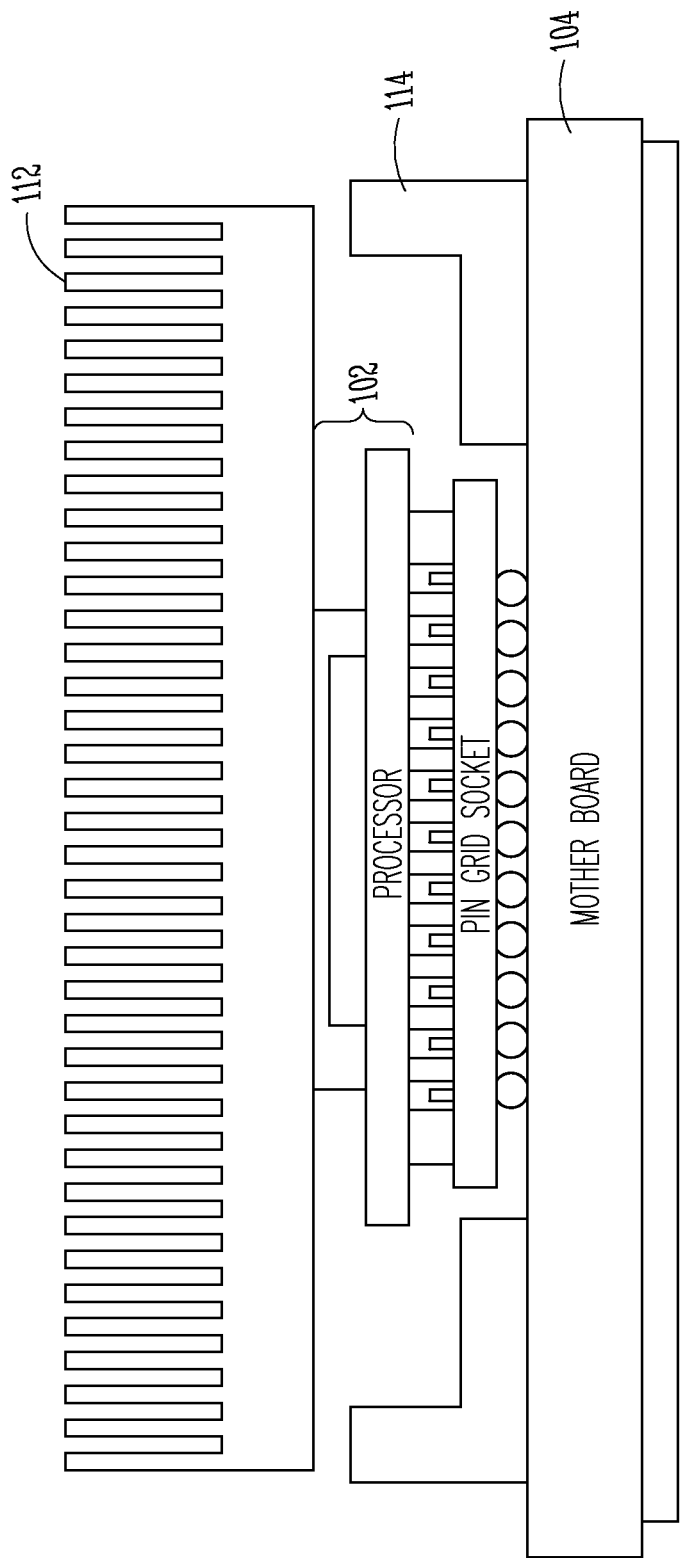

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As explained previously herein, it is desired to increase the physical size of the processor package (or any assembly involving a high-cost component) without increasing yield loss. A non-permanent interconnect between components would improve yield, but non-permanent interconnect solutions typically have less desirable electrical properties such as increased power consumption due to high contact resistance, increased droop due to loop inductance, and increased signal losses and latency due to contact geometry.

FIG. 1A is an illustration of an example of a liquid metal interconnect (LMI) between a processor package 102 and a mother board 104. The LMI includes two halves, a liquid metal well array 106 and a pin grid array socket 108. The liquid metal well array 106 includes liquid metal wells that contact the pins 109 of the pin grid array socket 108. The liquid metal of the liquid metal well array 106 can be any metal that has a melting point at or near room temperature. Some examples include cesium, gallium, and rubidium. In some examples, the liquid metal is an alloy of gallium and indium. The liquid metal may also be a eutectic that is an alloy having a melting point at or near room temperature.

The LMI provides a non-permanent zero-force interconnect for integration of components directly to the processor package 102. The LMI provides electrical properties that are comparable to a direct solder connection between components and is compact in form allowing for high density functionality without significant package growth. The LMI provides architectural flexibility without increasing the yield loss of a high-priced component such as a processor.

In the example of FIG. 1A, the liquid metal well array 106 is attached to the processor package 102 while the pin grid array socket 108 is soldered to the mother board 104. The position of the components could be reversed. The liquid metal well array 106 may be directly attached to the mother board 104 and the pin grid array socket 108 may be attached to the processor package 102. In some examples, a sealing film, or cap seal 110, may be used to hold the liquid metal in place until attachment is made.

FIG. 1B is an illustration of the example processor package of FIG. 1A with a heat sink 112 and mechanical loading mechanism 114 (e.g., a clamp) for mechanical retention is added. The LMI approach can be extended for use with processor packages as a fine pitch separable interconnect for companion devices and components creating a system on chip (SoC) architecture.

Figure 2:
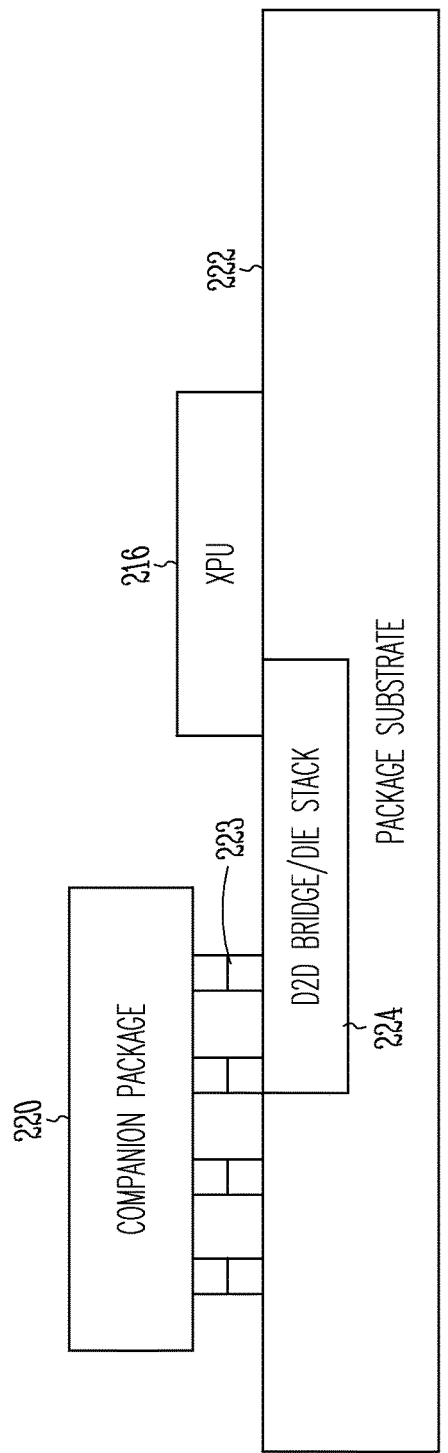
FIG. 2 is an illustration of a side view of an approach to an interconnection useful for a system on chip in accordance with some example embodiments.

FIG. 2 is an illustration of a side view of a conventional approach to an interconnection useful for a system on chip. The electronic package includes a processor IC 216, and a companion component package 220 mounted on the top surface of a package substrate 222 using solder bumps 223 or direct copper-to-copper bonds. The companion component package 220 is an electronic package that includes a companion component to functionality of the processor IC. Examples include one or more memory ICs, a field programmable gate array (FPGA), an input-output (I/O) controller, etc. The companion component package 220 is electrically connected to the processor IC 216 using electrical interconnect of the package substrate 222. In the example of FIG. 2, this package interconnect includes a die-to-die bridge 224 (D2D bridge) that is connected to conductive pillars (e.g., metal pins) of the companion component package 220. The conductive pillars can be connected to conductive pillars of the package substrate 222 using solder bumps. Electrical continuity to the processor IC 216 is through the die-to-die bridge 224. The die-to-die bridge 224 provides a fine pitch connection that provides close coupling between the one or more processors and the companion component. However, this type of coupling between devices is a permanent connection. This permanent connection can be costly because a problem causing loss of the companion component results in loss of the processor IC as well, which may be an expensive component.

Figure 3:
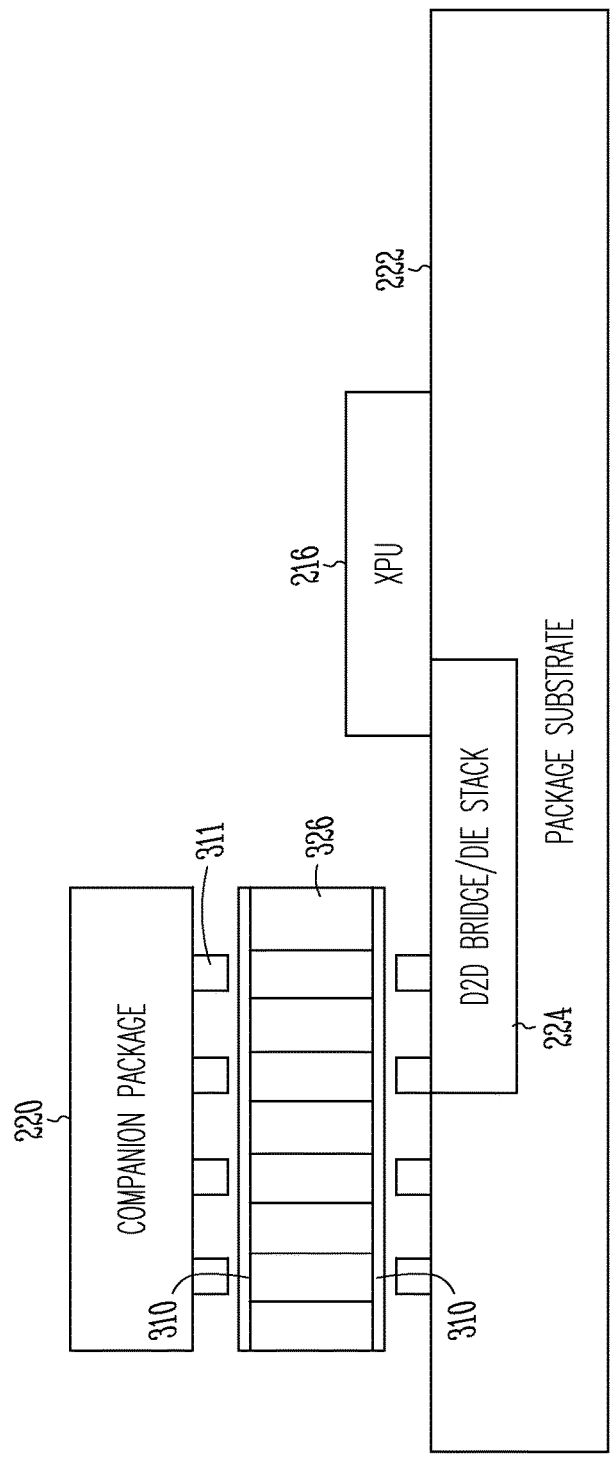
FIG. 3 is an illustration of a side view of a liquid metal interconnect approach for system on chip interconnection in accordance with some example embodiments.

FIG. 3 is an illustration of a side view of an LMI approach to an SoC interconnection. A liquid metal well array 326 is used to connect the conductive pillars 311 of the companion component package 220 to the conductive pillars on the top surface of the package substrate 222 and the die-to-die bridge 224. The liquid metal well array 326 includes multiple dual sided liquid metal wells. The liquid metal well array 326 can include a cap seal 310 on the top surface and the bottom surface. In some examples, the liquid metal has a zero flow rate, and the liquid metal well array 326 does not include a cap seal 310.

Because this is not a permanent connection the yield loss of the companion device does not significantly impact the cost of the system package. Also, the liquid metal wells have the same electrical characteristics as a solder bump so the electrical functionality of the system package is not changed. The package substrate 222 may be mounted to a pin grid array socket 108 using another liquid metal well array 106 as in FIG. 1A or using solder bumps.

FIG. 4 is an illustration of a side view of another example of an LMI. The example of FIG. 4 the package interconnect 428 includes conductive traces formed in the package substrate and does not include the die-to-die bridge 224 of the example of FIG. 3. The package interconnect 428 provides the fine pitch connection for the connection to conductive pillars of the package substrate 222. The result is also a non-permanent connection between the companion component package 220 and the package substrate 222.

FIG. 5 is an illustration of a side view of another example of an LMI. The LMI has a liquid metal well array 526 that includes one-sided liquid metal wells. The conductive pillars 311 of the companion component package 220 are attached to the top side of the liquid metal well array 526 as in the examples of FIGS. 3 and 4. The bottom side of the liquid metal well array 526 can include solid metal contact pads 530 that provide electrical continuity to the liquid metal wells and are adhered directly to contact pads of the package substrate 222. The top side of the liquid metal well array 526 may include a cap seal 310. The connection of the liquid metal well array 526 to the package substrate 222 is a permanent connection, but the connection to the companion component package 220 is a non-permanent separable connection.

The companion component package 220 can include a functional companion component to a processor such as a memory IC, a field programmable gate array (FPGA), an input-output (I/O) controller, etc. In some examples, the companion component is a power component, such as a voltage regulator IC or a voltage regulator circuit. The companion component package 220 may provide a regulated voltage supply for the processor IC 216 to provide top side power delivery to the processor IC 216. The voltage regulator circuit may be a converter circuit. In certain examples, the voltage converter circuit uses pulse width modulation to generate the regulated voltage supply.

Figure 6A:
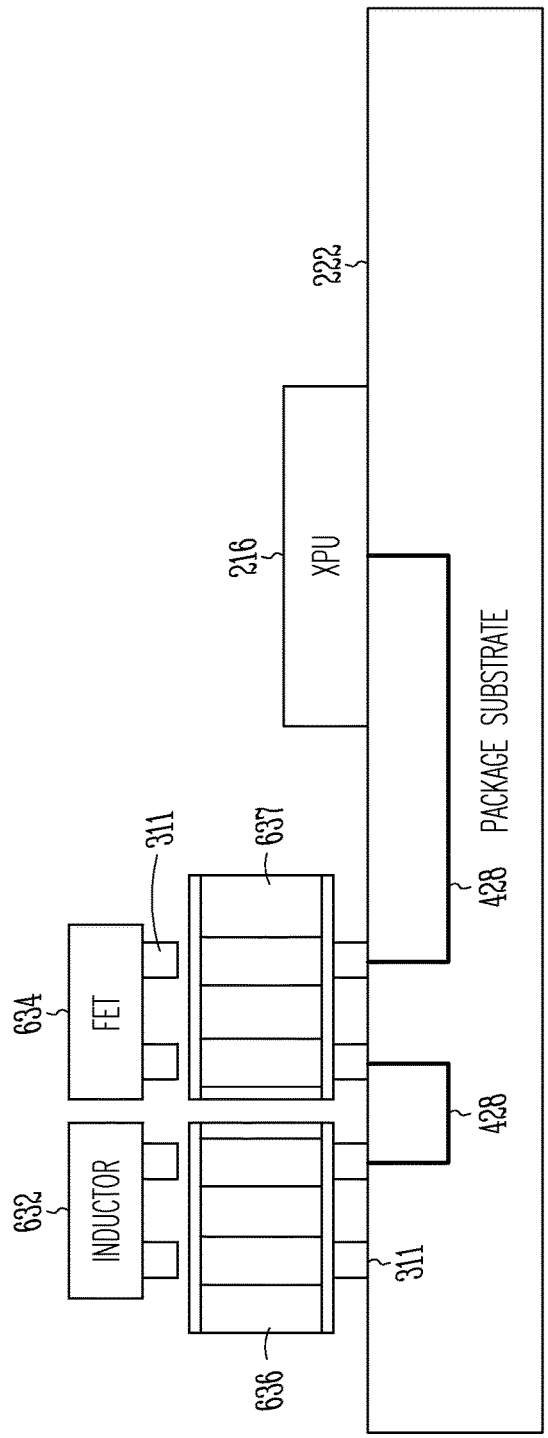
FIGS. 6A-6B illustrate another example of a liquid metal interconnect approach in accordance with some example embodiments.

FIG. 6A is an illustration of a side view of another example of an LMI. In the example, the companion component package includes a portion of a voltage regulator circuit. The processor IC 216 may include more of the voltage regulator circuit, but the voltage regulator circuit may use discrete components not included in the processor IC 216. These discrete components can be connected using an LMI. In the example of FIG. 6A, the voltage regulator circuit may be a switching converter circuit and the discrete components can include an inductor 632 and a power field effect transistor (FET) 634. Each discrete component is connected to the package substrate 222 using a liquid metal well array 626, 627 that includes two-sided liquid metal wells to connect to conductive pillars of the package substrate 222 and the discrete components.

Figure 6B:
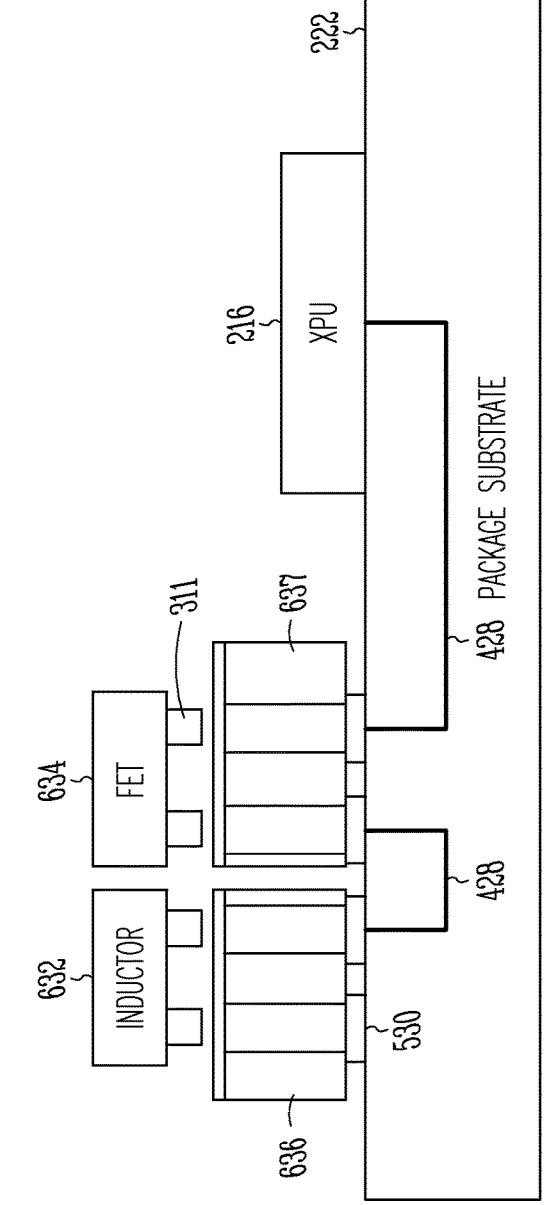

In the example of FIG. 6B, each discrete component is connected to the package substrate 222 using a liquid metal well array 636, 637 that includes one-sided liquid metal wells to connect to conductive pillars of the discrete components and to connect to contact pads of the package substrate 222. The approaches in FIGS. 6A, 6B decouple the yield loss issues associated with companion components as part of the packaging cost and allow for repair and replacement of companion components in the field. This LMI approach allows for placement of components that would not normally be considered for integration directly on a package due to reliability concerns. The non-permanent connection of LMI with the electrical characteristics of direct solder attach also allows for top sided signal egress options.

FIG. 7A is an illustration of a side view of another example of an LMI. A high-speed I/O (HSIO) connector 740, or part of such a connector, is adhered directly to the package of the companion component package 720. The HSIO connector 740 may be either an electrical or optical connection and may be included in an HSIO lane. The companion component package 720 is connected to the package substrate 222 using a liquid metal well array 326 that includes two-sided liquid metal wells. In FIG. 7B, the companion component package 720 is connected to the package substrate 222 using a liquid metal well array 526 that includes one-sided liquid metal wells. The liquid metal well array 526 is connected to the package substrate 222. The top-sided connection to the HSIO connector reduces the number of connections that need to egress through the bottom side of the package to the mother board. Because the connection of companion IC for the HSIO is non-permanent and separable, the companion IC can be easily replaced in case of a failure.

Figure 8:
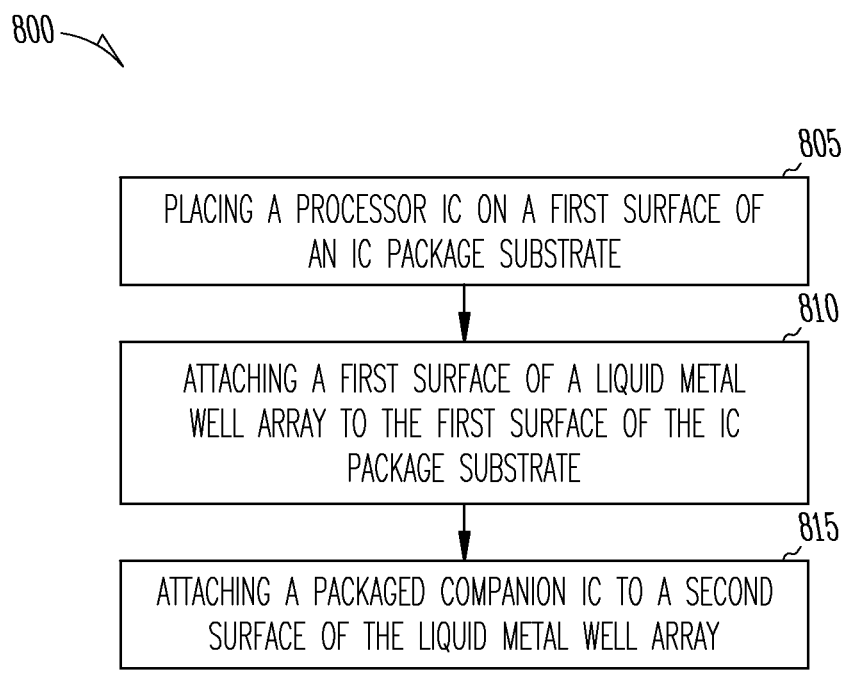
FIG. 8 is a flow diagram of an example of a method of method of manufacture of an electronic device that includes liquid metal interconnect in accordance with some example embodiments.

FIG. 8 is a flow diagram of an example of a method 800 of forming an electronic device that includes an LMI. The electronic device can include an SoC. At block 805, a processor integrated circuit (IC) is placed on a first surface of an IC package substrate. The processor IC can include one or more processors. The processor IC may be a CPU or graphic processor unit (GPU). The processor IC may be included in a processor package substrate includes electrically conductive package interconnect, and the processor IC is electrically connected to the package interconnect.

At block 810, a first surface of a liquid metal well array is attached to the first surface of the IC package substrate. In some examples, the liquid metal well array includes two-sided liquid metal wells, and the first surface of the liquid metal well array is attached to conductive pillars (e.g., pins) attached to the first surface of the IC package substrate. In some examples, the liquid metal well array may include one-sided liquid metal wells, and the first surface of the liquid metal well array is attached to contact pads of the first surface of the IC package substrate using solder.

At block 815, a companion component is attached to a second surface of the liquid metal well array. The companion component can be a packaged companion component that includes conductive pillars that are attached to the liquid metal wells on the second surface of the liquid metal well array.

The LMI approaches described herein result in an improved yield loss for system on chip assemblies because defective companion components can be easily removed and replaced, thereby reducing overall packaging costs. The LMI approaches provide equivalent electrical performance as direct solder connections between components on the processor package without a permanent direct solder application. Also, compute density is improved as companion components can be cost effectively attached to the processor.

Figure 9:
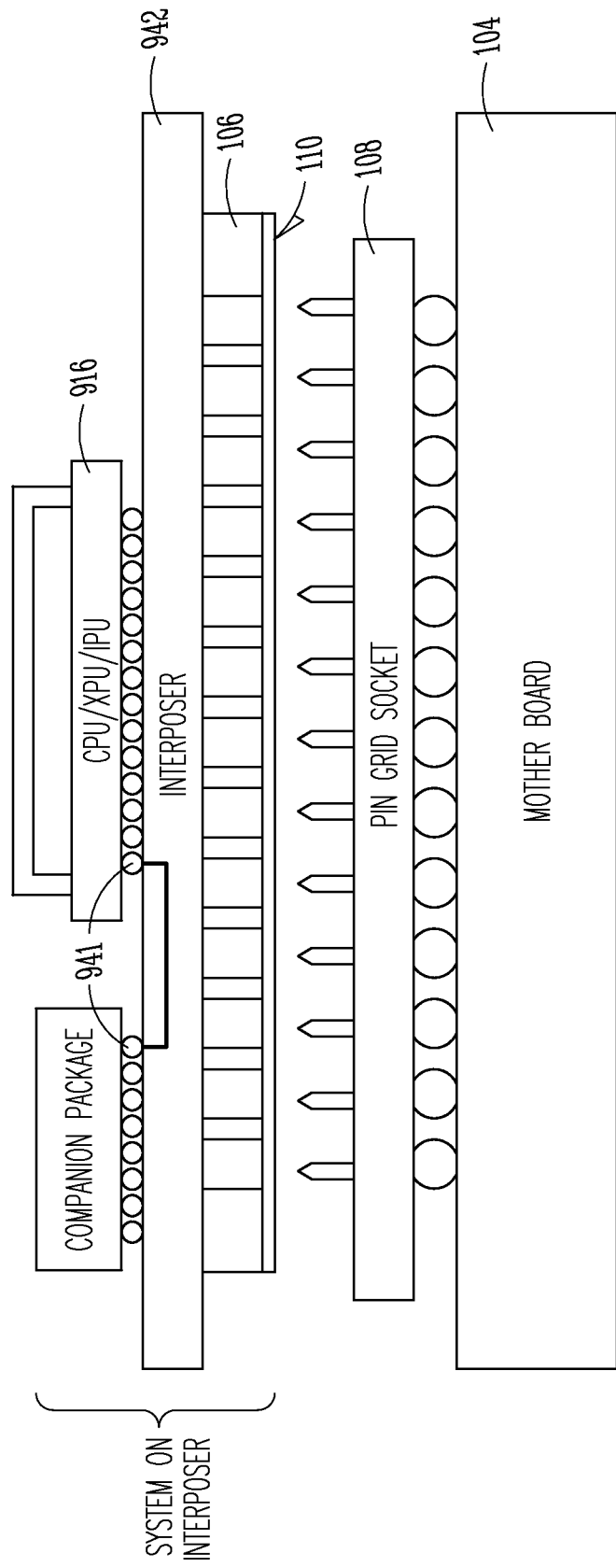
FIGS. 9-10 illustrate an example of a system on interposer assembly in accordance with some example embodiments.

FIG. 9 is an illustration of a side view of an example of a system on interposer assembly. A processor package 916 is attached to an LMI interposer 942 having a liquid metal well array 106. The liquid metal well array 106 may include two-sided liquid metal wells, or the liquid metal well array 106 may include one-sided liquid metal wells with the liquid metal well array attached to the interposer 942. A companion component package is also attached to the interposer 942 using solder bumps 941. The processor package 916 is attached directly to the interposer 942 as a functional block, and the liquid metal well array 106 of the interposer 942 is attached to the mother board 104 using a pin grid array socket 108. Thus, the connection between the pin grid array socket 108 and the interposer 942 is a separable non-permanent connection. The processor package 916 can be attached to the interposer 942 with one pin pitch and the interposer 942 can be attached to the mother board 104 with another pin pitch. This system on interposer assembly decouples the mother board pitch constraints from the processor pitch allowing for optimized processor sizing.

Incorporation of the interposer in the architecture also allows for addition of companion components (e.g., memory, FPGA, VR module, HSIO, etc.) near the processor. The companion components can be co-located on the interposer 942 adjacent to the processor package 916 without the additional burden of increasing pin count on the interconnect to the mother board 104. The interposer 942 includes interconnect 928 to electrically connect the companion components to the processor. In certain examples, the interposer interconnect can include a die-to-die bridge.

Figure 10:
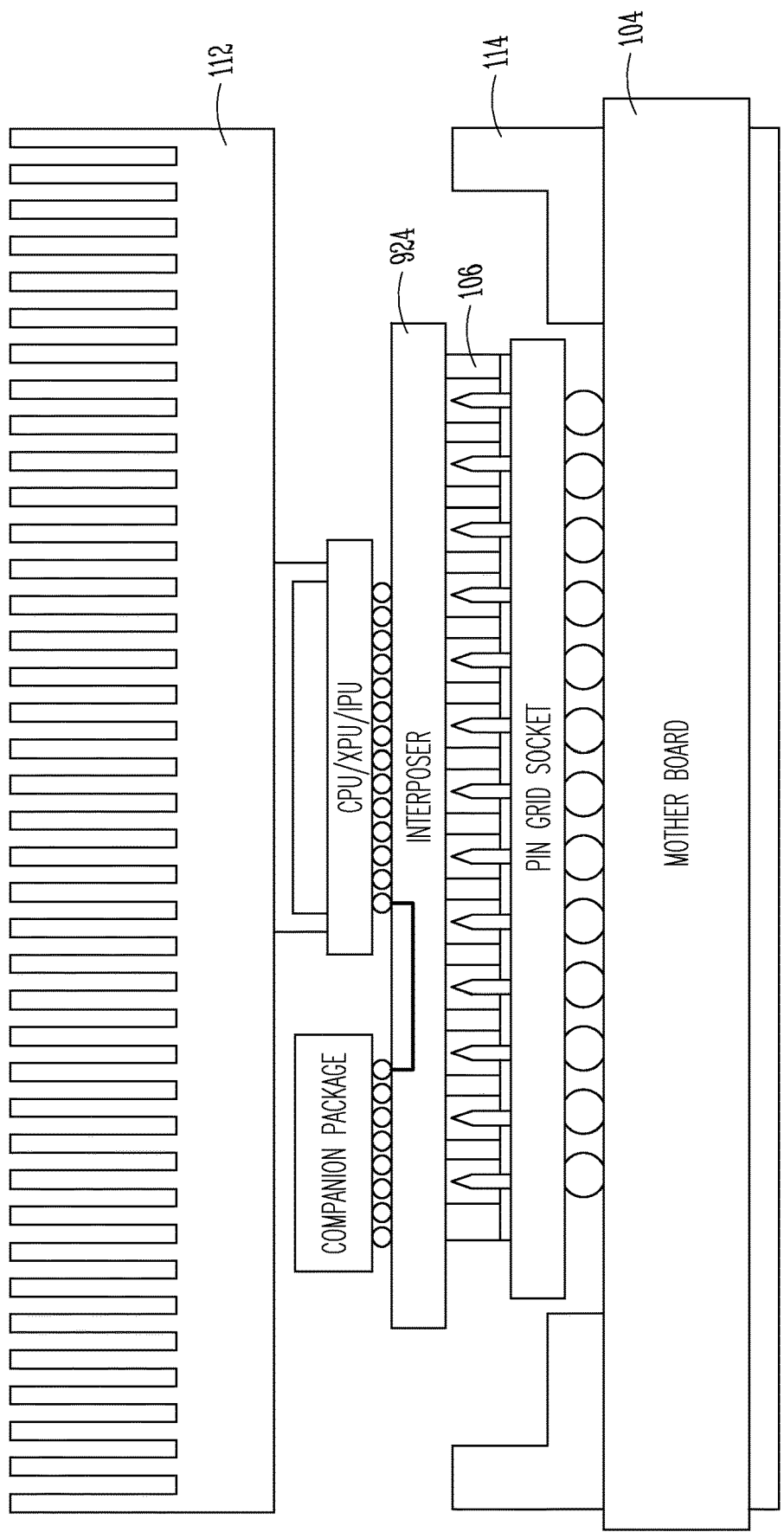

FIG. 10 is an illustration of the example assembly of FIG. 9 with a heat sink 112 and mechanical loading mechanism 114 (e.g., a clamp) added. Because of the liquid metal well array 106, the LMI interposer 942 has a lower mechanical loading requirement compared to conventional LGA socket approaches. This allows for a reduced mechanical keep out area that frees up space on the mother board 104.

Figure 11:
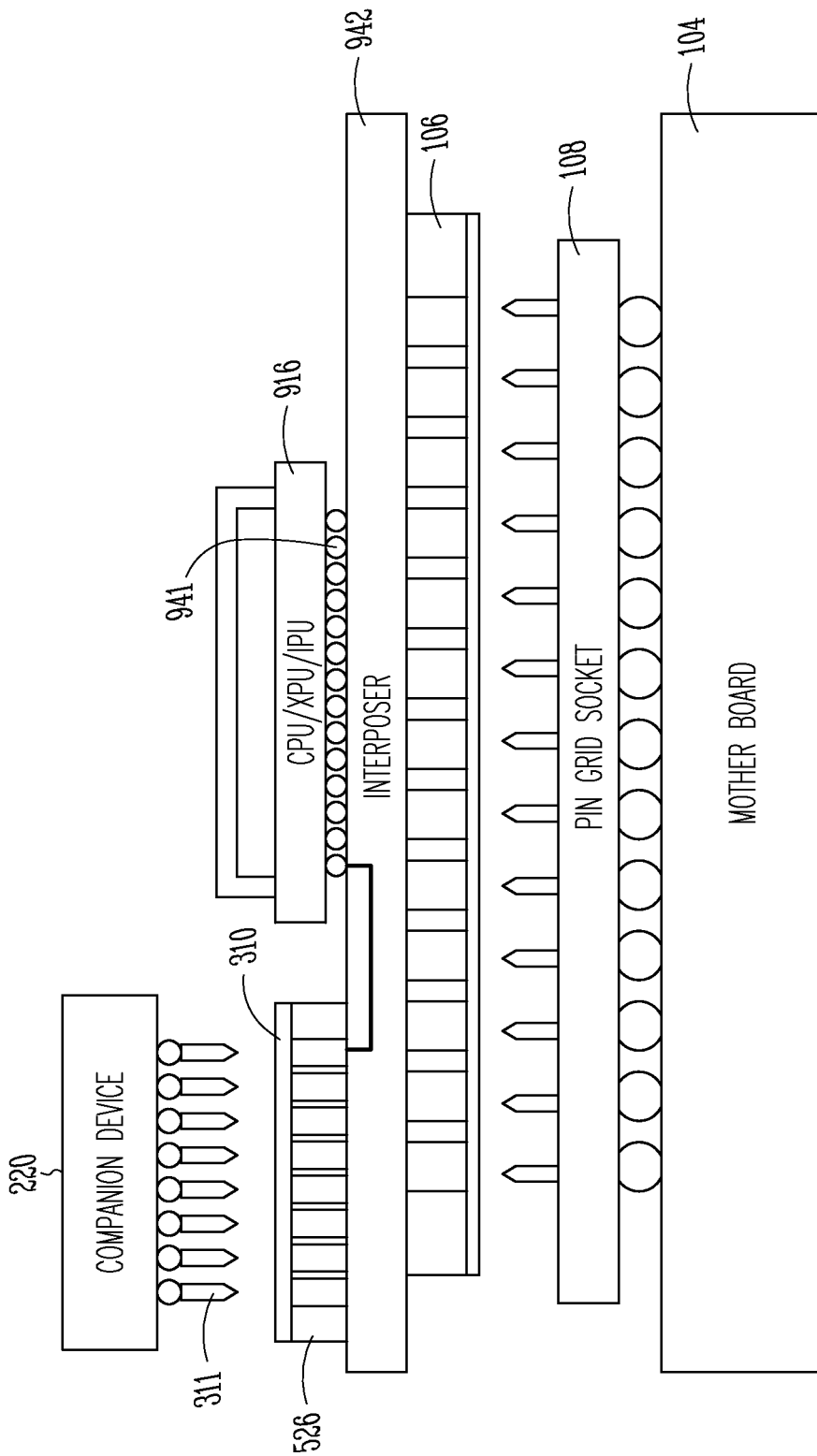
FIG. 11 is an illustration of a side view of another example of a system on interposer assembly in accordance with some example embodiments.

FIG. 11 is an illustration of a side view of an example of a system on interposer assembly. The interposer 942 includes the liquid metal well array 106 on the bottom surface and the interposer 942 attaches the processor package 916 to the mother board 104 using a pin grid array socket 108 as in FIG. 9. The interposer 942 includes another liquid metal well array 526 on the top surface. In the example of FIG. 11, the second liquid metal well array 526 includes one-sided liquid metal wells to connect to the conductive pillars 311 of the companion component package 220. The second liquid metal well array 526 can include a cap seal 310 on the top surface. In some examples, the second liquid metal well array 526 includes two-sided liquid metal wells to connect to the conductive pillars 311 of the companion component package 220 and to pins (not shown) on the top surface of the interposer 942. The two-sided liquid metal wells can include a cap seal 310 on the bottom surface of the second liquid metal well array 526.

The non-permanent connection of the companion component in the example of FIG. 11 allows for easy replacement of the companion component in case of failure. Thus, the yield loss of the companion component does not contribute to the cost of processor system. Also, because the liquid metal wells have the same electrical characteristics as solder bumps, the electrical functionality between the companion component, the processor, and the mother board is not changed.

Figure 12:
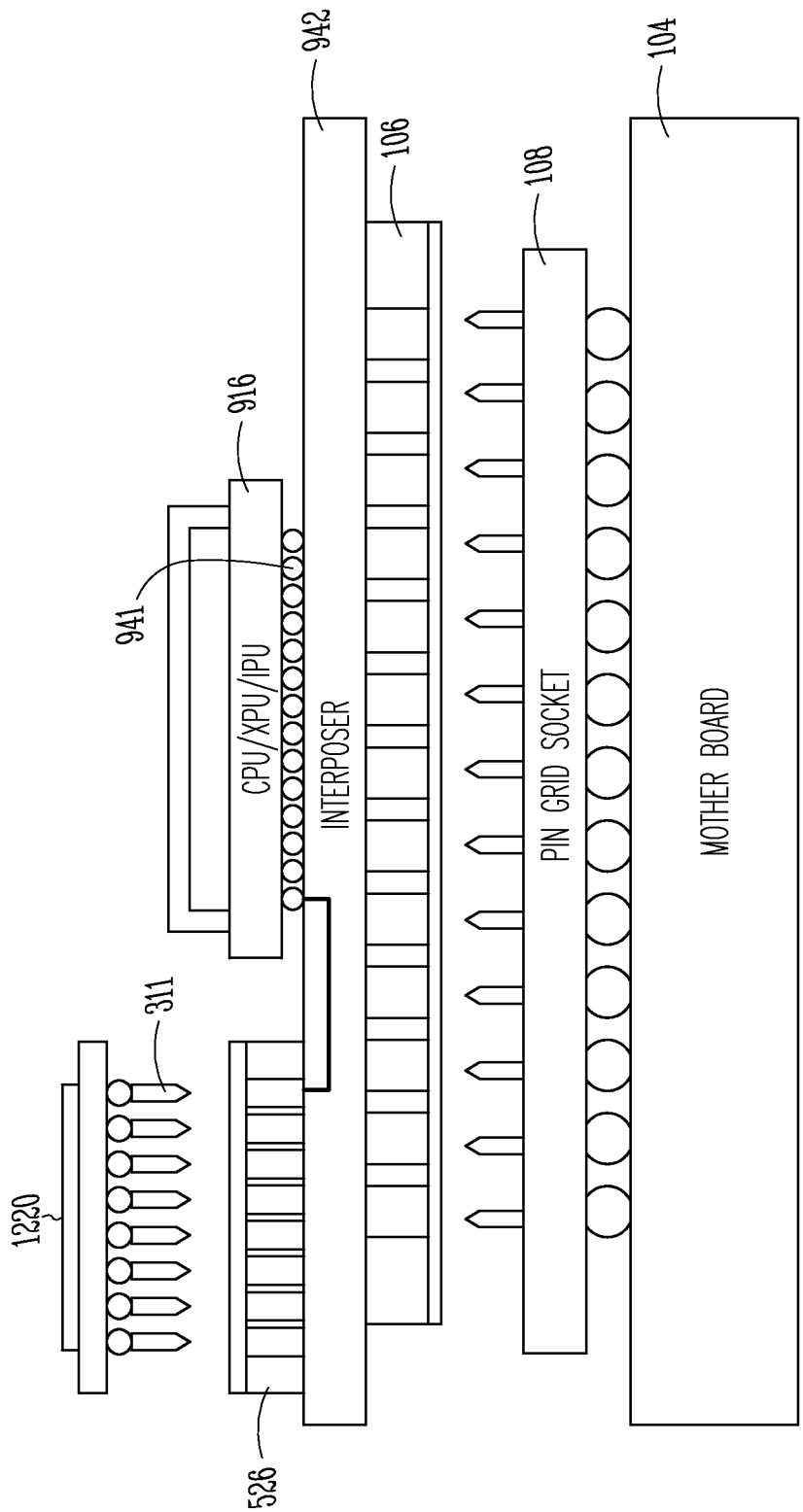
FIGS. 12-15 illustrate additional examples of a system on interposer assemblies in accordance with some example embodiments.

Different functional topologies can be achieved by selection of component devices placed on the interposer 942 in conjunction with the one or more processors of the processor package 916. Like the examples of FIGS. 3 and 4, the companion component can be a functional companion device like an FPGA, memory, or an I/O controller. FIG. 12 is an illustration of a processor system on interposer assembly in which the companion component includes a memory IC 1220 as companion memory to the processor of the processor package 916.

Figure 13:
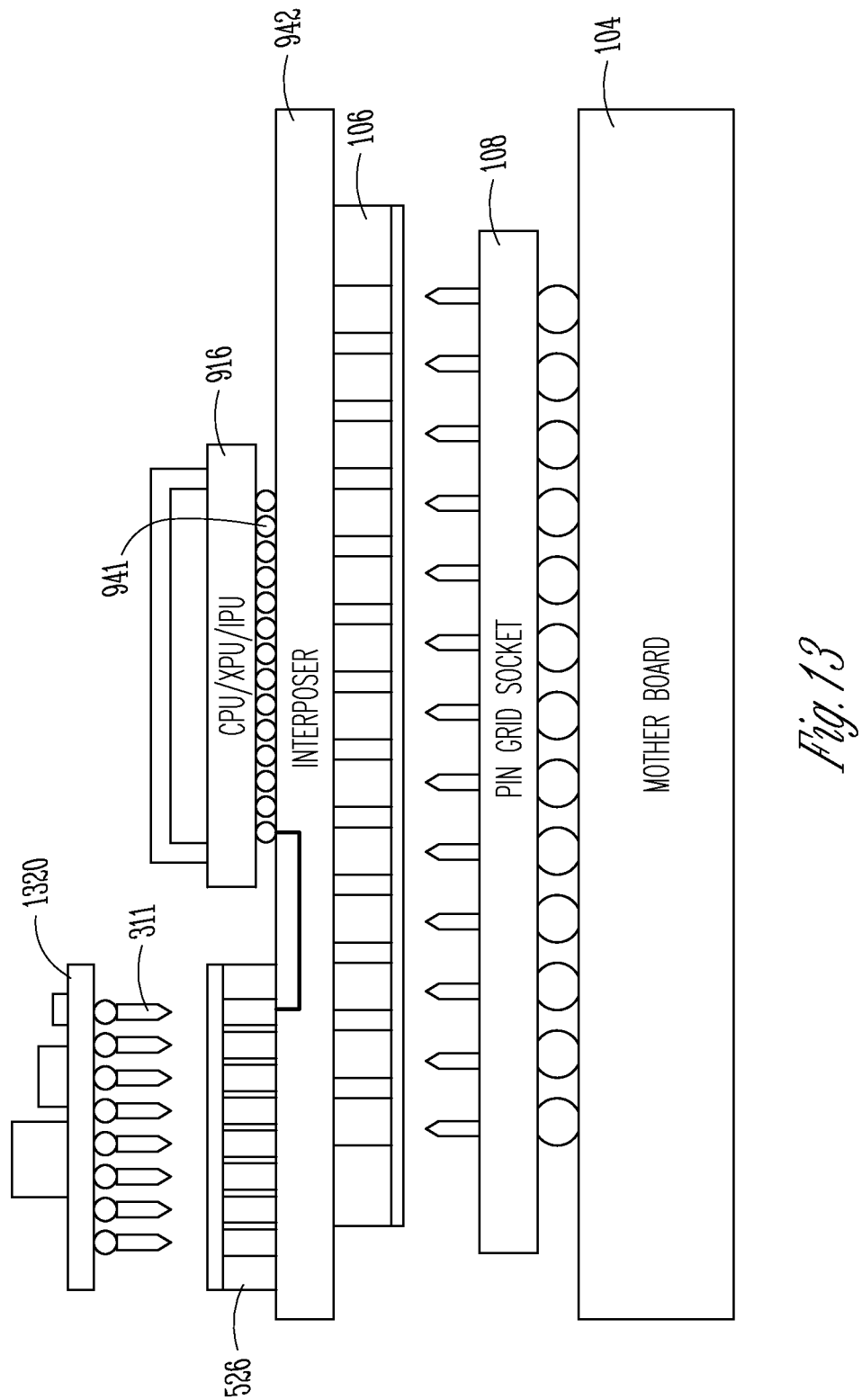
Figure 14:
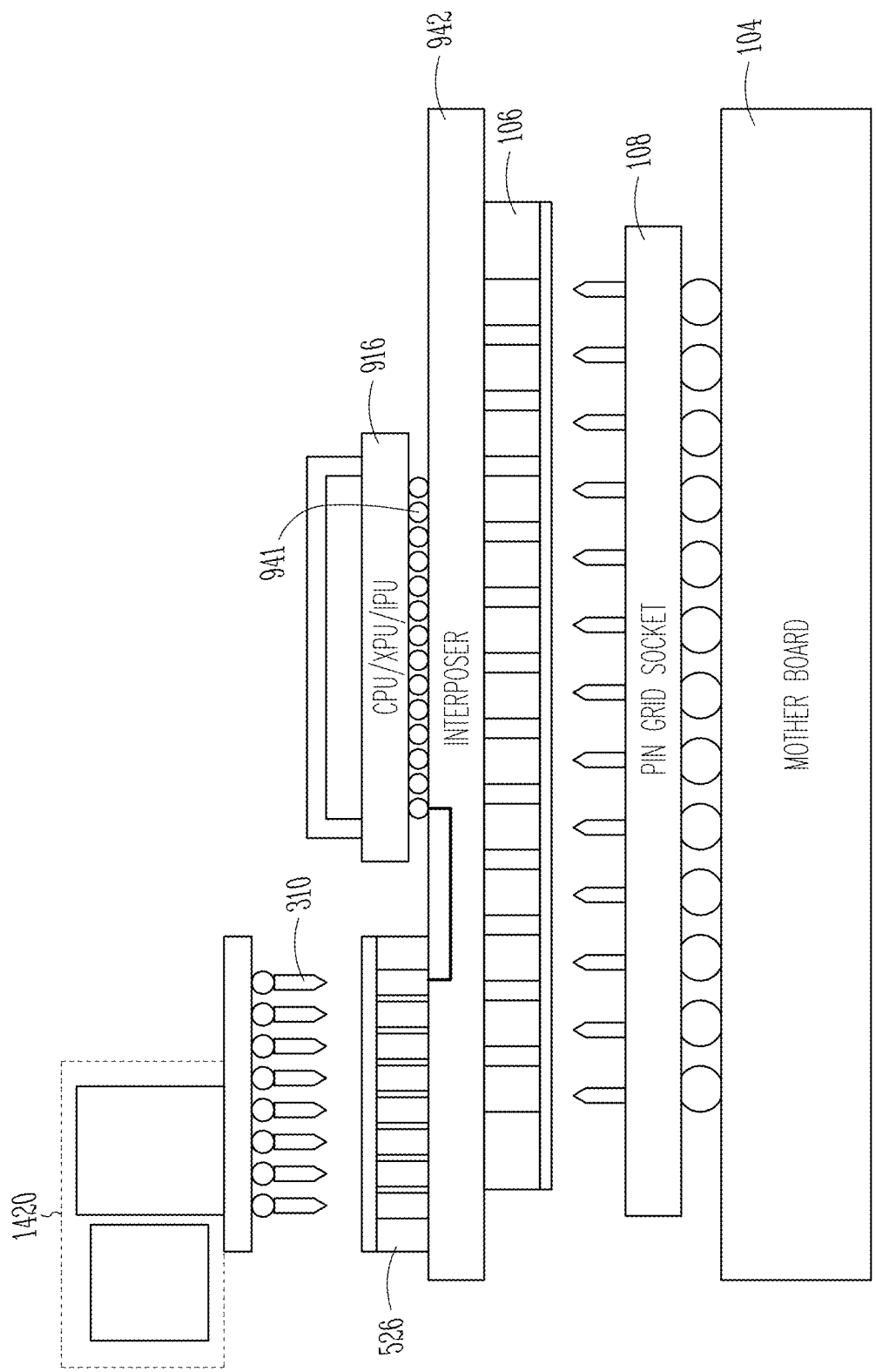

The companion component can be a companion power component. FIG. 13 is an illustration of a processor system on interposer assembly in which the companion component is a companion voltage regulator circuit 1320 that provides basic or additional power to the processor package 916. FIG. 14 is an illustration of a processor system on interposer architecture in which the companion component provides near stack HSIO connections 1420 co-located with processor package 916 for improved signal integrity performance. These non-limiting examples show that using the interposer 942 allows different companion devices to be combined on the interposer 942 to create different system on interposer architectures without added yield loss from the individual companion components.

Figure 15:
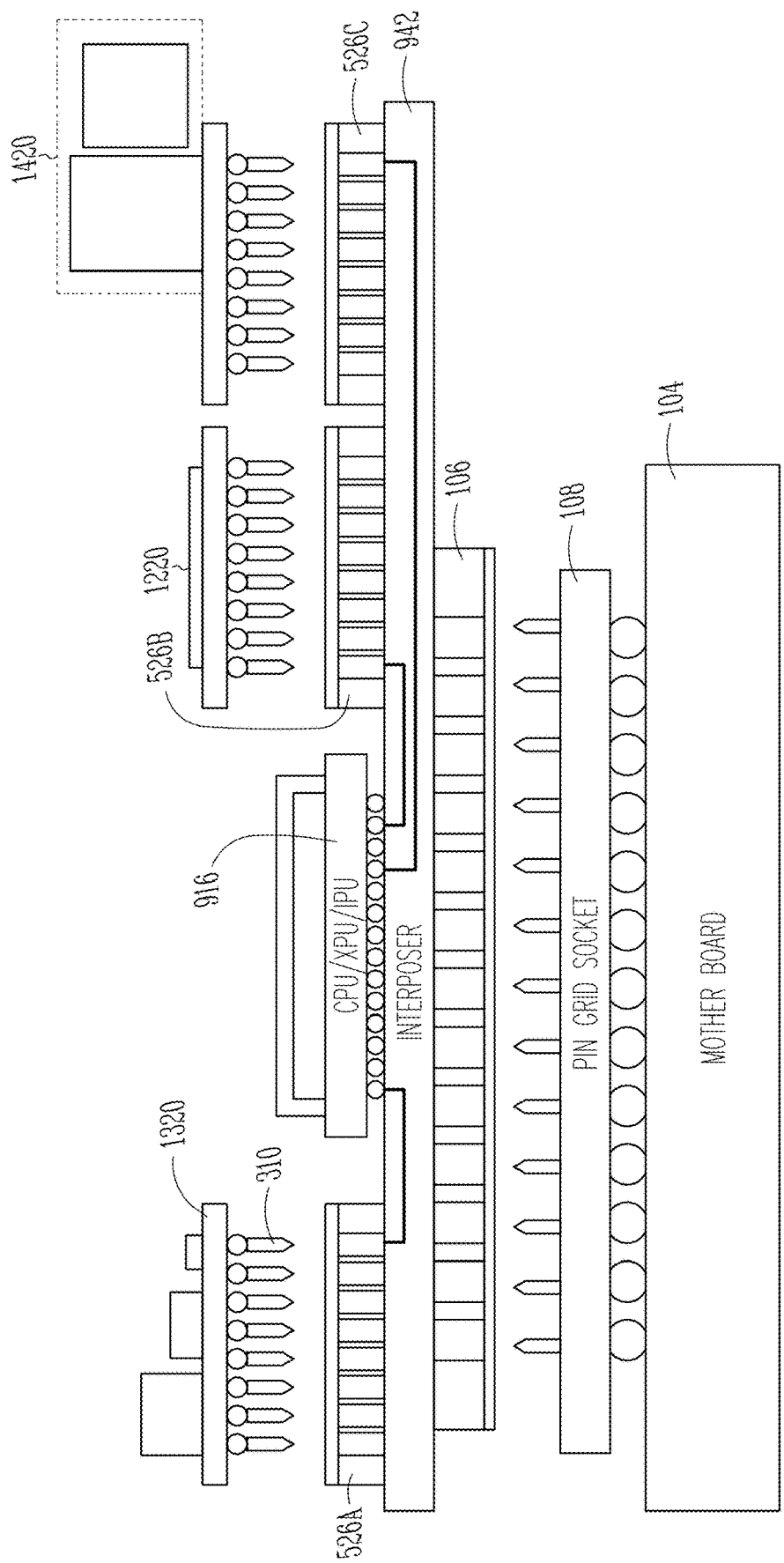

FIG. 15 is an illustration of an example of a system on interposer architecture in which multiple companion components to the processor are included on the interposer 942. The companion components include a companion voltage regulator circuit 1320, a memory IC 1220, and a near stack HSIO connection 1420. The interposer 942 includes multiple liquid metal well arrays 526A, 526B, 526C on the top surface to attach the companion components to the interposer 942. The liquid metal well arrays attached to the top surface of the interposer 942 have a finer pitch than the liquid metal well array 106 attached to the pin grid array socket 108 and may have the same pitch as the processor package 916.

Figure 16:
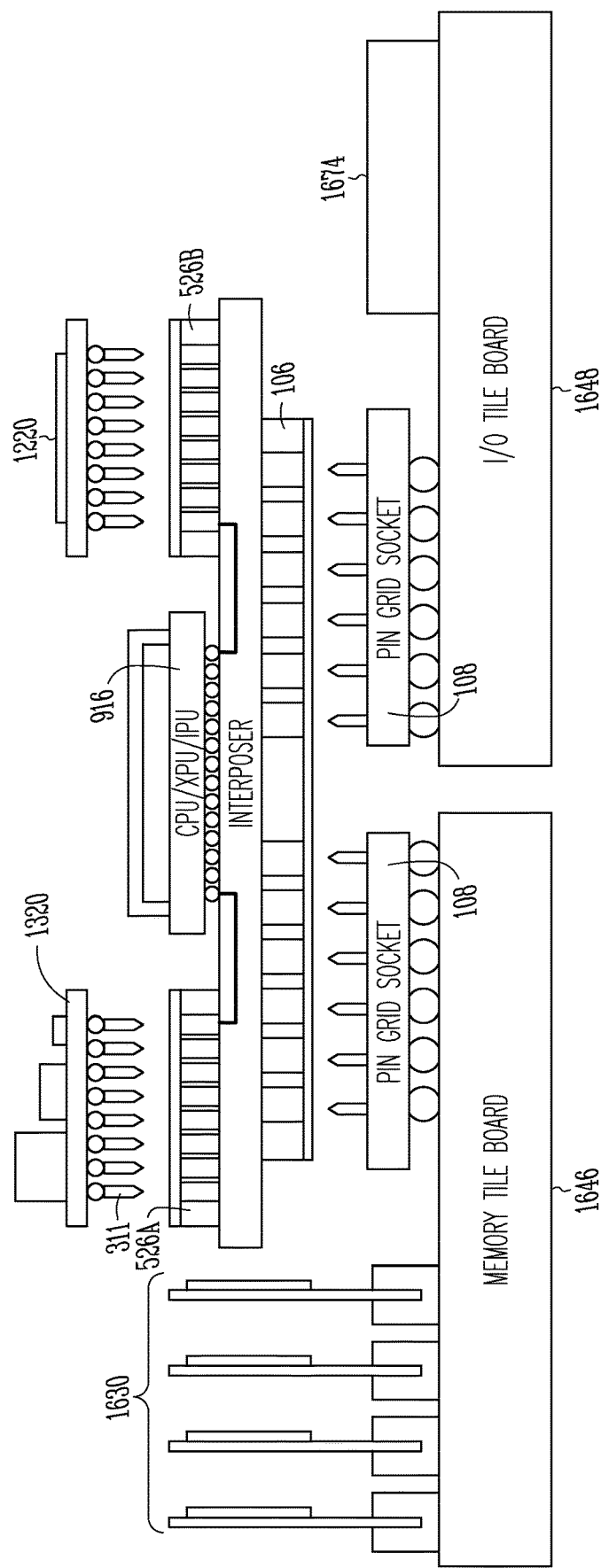
FIG. 16 is an illustration of a side view of another example of a system on interposer architecture in accordance with some example embodiments.

FIG. 16 is an illustration of a side view of an example of a system on interposer architecture in which an interposer is attached to multiple printed circuit boards (PCBs) using LMI. The system includes a processor package 916 attached to the interposer 942. Multiple companion components are attached to the top surface of the interposer using liquid metal well arrays 526A, 526B. The liquid metal well array 106 on the bottom surface of the interposer 942 is connected to two pin grid array sockets 108. Some of the liquid metal wells of the liquid metal well array 106 are attached to one of the pin grid array sockets and some of the liquid metal wells of the liquid metal well array 106 are attached to the other pin grid array socket. The pin grid array sockets 108 are connected to PCBs. The PCBs may be different mother boards. In the example of FIG. 16, the PCBs are tile boards, including a memory tile board 1646 and an I/O tile board 1648. The memory tile board 1646 includes system memory 1630 and the I/O tile board 1648 can include one or more I/O devices 1674.

The system on interposer provides a tiled architecture for disaggregation of traditional servers with the system on interposer providing the primary compute function. The tiled architecture allows for smaller companion boards instead of the more traditional single mother board approach to the architecture. This approach simplifies the mother board architecture approach. Board yield loss is improved thereby providing opportunities to marry different board combinations to a single interposer for targeted applications. Because the liquid metal well array 106 provides a non-permanent connection between the interposer 942 and the tile boards, yield loss of the system memory 1630 or the I/O device 1674 does not impact the yield of the processor system on interposer package.

Figure 17:
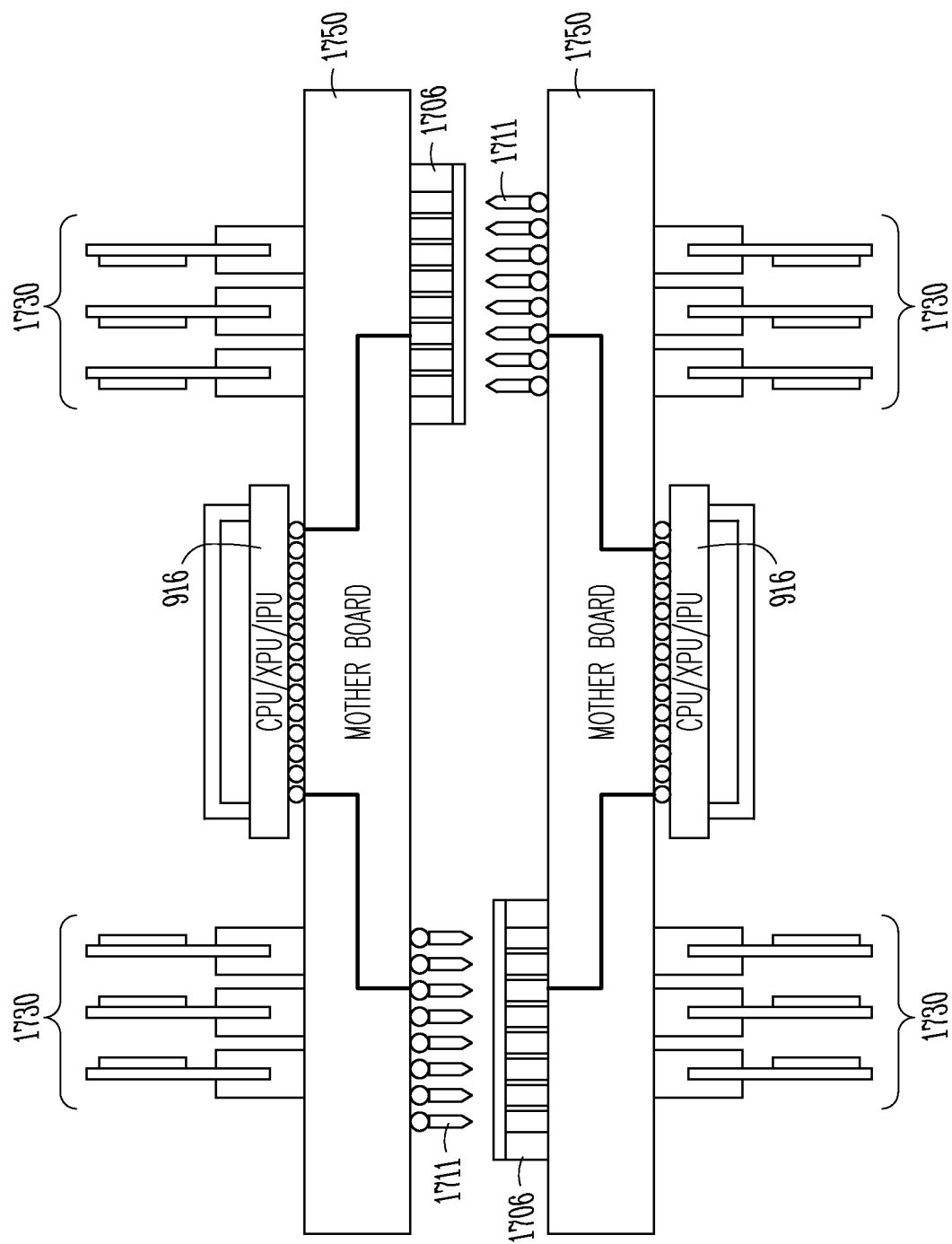
FIG. 17 is an illustration of a side view of another example of a system that includes a liquid metal interconnect in accordance with some example embodiments.

FIG. 17 is an illustration of a side view of another example of a system that includes an LMI. The system includes back-to-back connected interposers 1750. In the example of FIG. 17, mother boards are used as the interposers 1750. The interposers 1750 include electrically conductive interposer interconnect 1748, and processor packages 916 are attached to one surface of the interposers 1750 and the interposer interconnect 1748. The example of FIG. 17 shows two processor packages on the interposers 1750, but any expensive electronic device package can be attached to the interposers 1750 and the devices on the interposers can be different from each other. System memory 1730 is attached to the same surface of the interposers as the processor package 916. The LMI connects the interposers 1750. The LMI is a mezzanine type connection and allows a back-to-back system configuration to improve the overall compute density.

The interposers each include a liquid metal well array 1706 on the surface of the interposer opposite the processor package 916. The liquid metal well arrays 1706 may include two-sided liquid metal wells, or the liquid metal well array 1706 may include one-sided liquid metal wells with the liquid metal well array attached to the interposers 1750 using solder bumps. Each interposer 1750 includes conductive pillars 1711 that are connected to the interposer interconnect. The liquid metal well array 1706 of one interposer is attached to conductive pillars 1711 of the other interposer. It is to be noted that the back-to-back LMI is a non-permanent connection regardless of whether the liquid metal well arrays 1706 include one-sided liquid metal wells or two-sided liquid metal wells.

Figure 18:
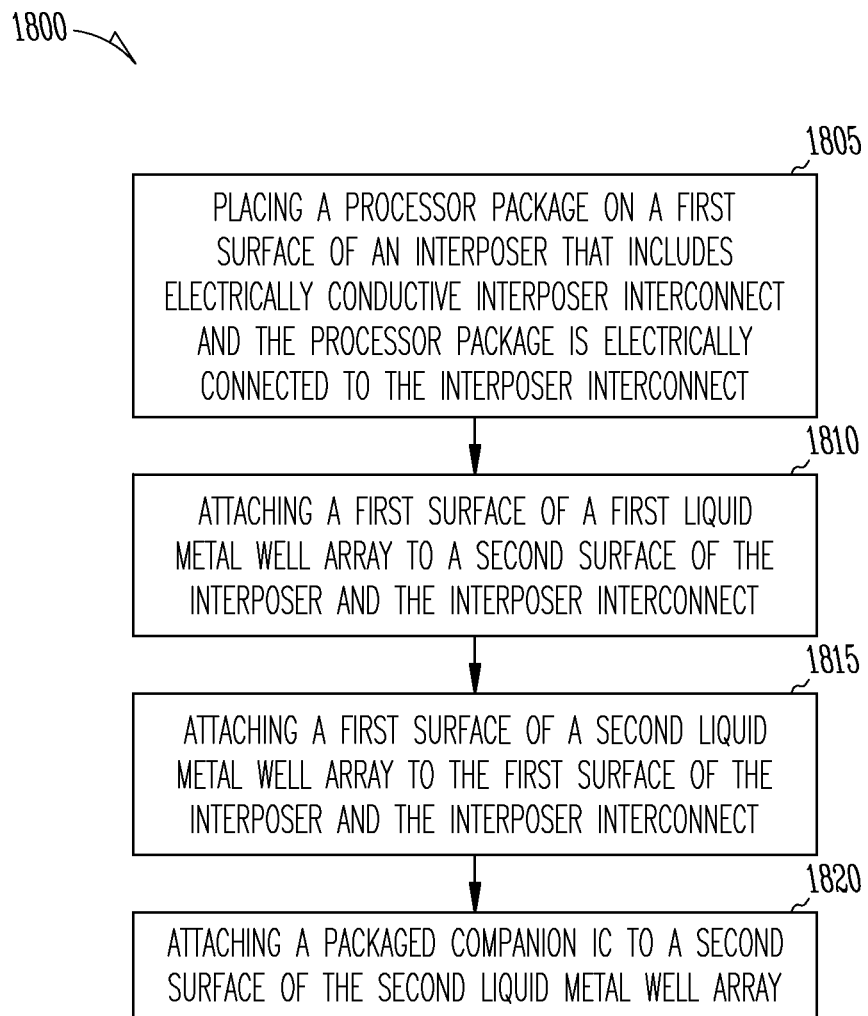
FIG. 18 is a flow diagram of an example of a method of manufacturing an electronic device having a system on interposer architecture in accordance with some example embodiments.

FIG. 18 is a flow diagram of an example of a method of making an electronic device having a system on interposer architecture. The electronic device may be any of the devices having a system on interposer assembly described herein. At block 1805, a processor package is placed on a first surface (e.g., the top surface) of an interposer. The interposer may be made from a PCB material (e.g., FR4) or a ceramic material. The interposer includes electrically conductive interposer interconnect and the processor package is electrically connected to the interposer interconnect.

At block 1810, a first surface of a first liquid metal well array is attached to a second surface (e.g., the bottom surface) of the interposer and the interposer interconnect. At block 1815, a first surface of a second liquid metal well array is attached to the first surface of the interposer and the interposer interconnect. One or both of the first liquid metal well array and the second liquid metal well array may include one sided liquid metal wells or two-sided liquid metal wells.

At block 1820, a companion component package is attached to a second surface of the second liquid metal well array. The companion component package includes a companion component to a processor of the processor package and can include any of the companion components described herein.

Figure 19:
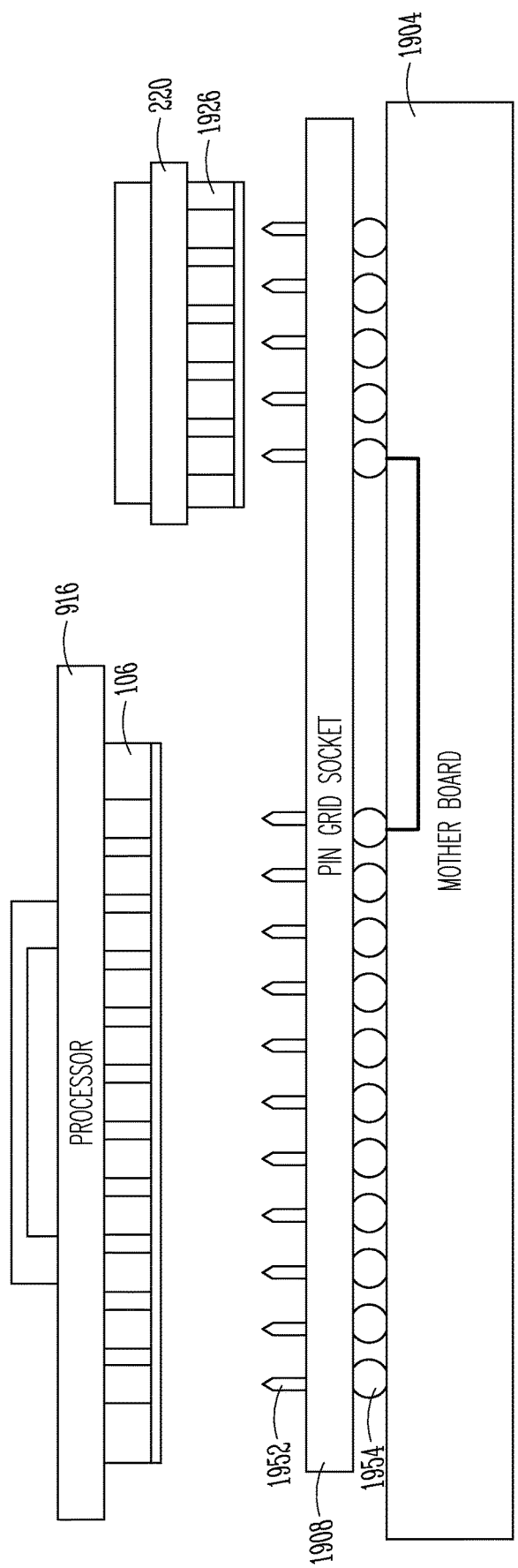
FIG. 19 is an illustration of a side view of another example of a system that includes a liquid metal interconnect in accordance with some example embodiments.

FIG. 19 is an illustration of a side view of another example of an electronic system that includes an LMI. The system includes a processor package 916 attached to a liquid metal well array 106. Because the liquid metal well array 106 has a lower mechanical loading requirement compared to conventional permanent connection approaches, the mechanical keep out area is reduced which frees up space on the mother board 1904. The liquid metal well array 106 can be attached to pins 1952 of a pin grid array socket 1908 that can be made larger to accommodate multiple packages. The pin grid array socket 1908 is attached to the mother board 1904 using solder bumps 1954. The system includes a companion component package 220 that can be placed adjacent to the processor package 916 using another liquid metal well array 1926. This allows for improved signal integrity because of the shortened routing lengths. However, electrical signals pass through the mother board 1904 between the processor package 916 and the companion component package 220 which complicates the mother board 1904 and increases latency between devices.

Figure 20:
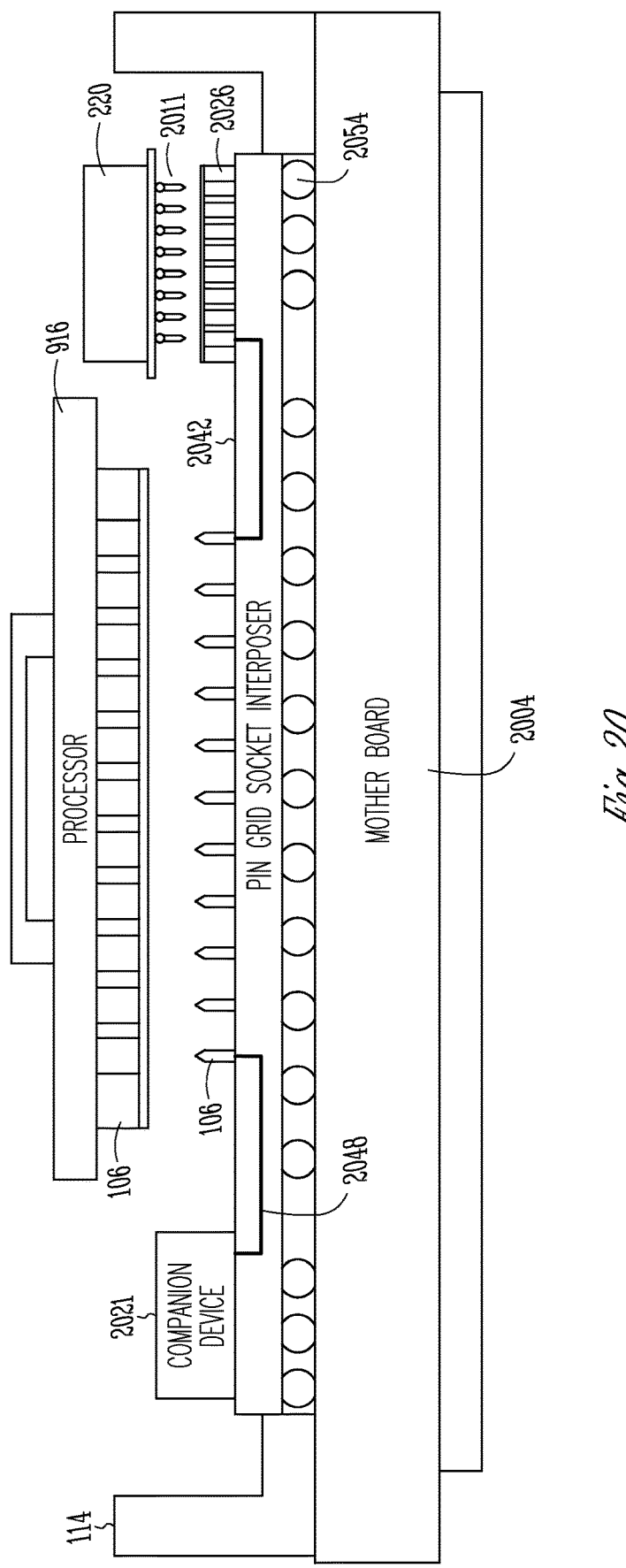
FIG. 20 is an illustration of a side view of another example of an electronic system that has a system on interposer architecture in accordance with some example embodiments.

FIG. 20 is an illustration of a side view of another example of an electronic system that has a system on interposer architecture. The pin grid array socket body of FIG. 19 is converted into an interposer 2042 by replacing the pin carrier with a pin grid circuit board. By doing so, the interposer 2042 can be designed to have electrical functionality. If the pin grid array socket incorporates an interposer with electrical functionality, functions can be shifted from the mother board 2004 to the pin grid socket interposer 2042 which simplifies the mother board 2004.

The processor package 916 and liquid metal well array 106 are attached to pins 2052 of the interposer. The interposer 2042 can include contacts pads on the bottom surface and the interposer 2042 can be attached to the mother board using solder bumps 2054. The system includes a second liquid metal well array 2026 attached to the interposer 2042. A companion component package 220 is connected to the liquid metal well array 2026 using conductive pillars 2011. The system includes another companion component package 2020 attached directly to the interposer 2042. A mechanical loading mechanism 114 may be included to provide mechanical retention.

The pitch of each of the liquid metal well array 106, liquid metal well array 2026, and the solder bumps 2054 can be different. The pitch of the liquid metal well array 2026 can be finer than the pitch of liquid metal well array 106, which is finer than the pitch of the connection to the mother board 2004. The interposer 2042 can include electrically conductive interconnect 2048 to provide pitch translation between the processor package 916, the companion component packages 220, 2020, and the mother board 2004. This decouples the motherboard manufacturing constraints from package boundary conditions.

Liquid metal well array 106 and liquid metal well array 2026 provide non-permanent connections for the processor package 916 and the companion component package 220, respectively. Either of the liquid metal well array may be a one-sided or two-sided liquid metal well array. If liquid metal well array 106 is a two-sided liquid metal well array, the processor package 916 may include conductive pillars that attach to the liquid metal wells of the liquid metal well array 106. If liquid metal well array 106 is a one-sided liquid metal well array, the processor package 916 may include contact pads that attach to contact pads of the liquid metal well array 106. The contact pads of a one-sided liquid metal well array provide electrical continuity to the liquid metal wells of the liquid metal well array.

If liquid metal well array 2026 is a two-sided liquid metal well array, the interposer 2042 may include conductive pillars that attach to the liquid metal wells of the liquid metal well array 2026. If liquid metal well array 2026 is a one-sided liquid metal well array, the interposer 2042 may include contact pads that attach to contact pads of the liquid metal well array 2026.

Figure 21:
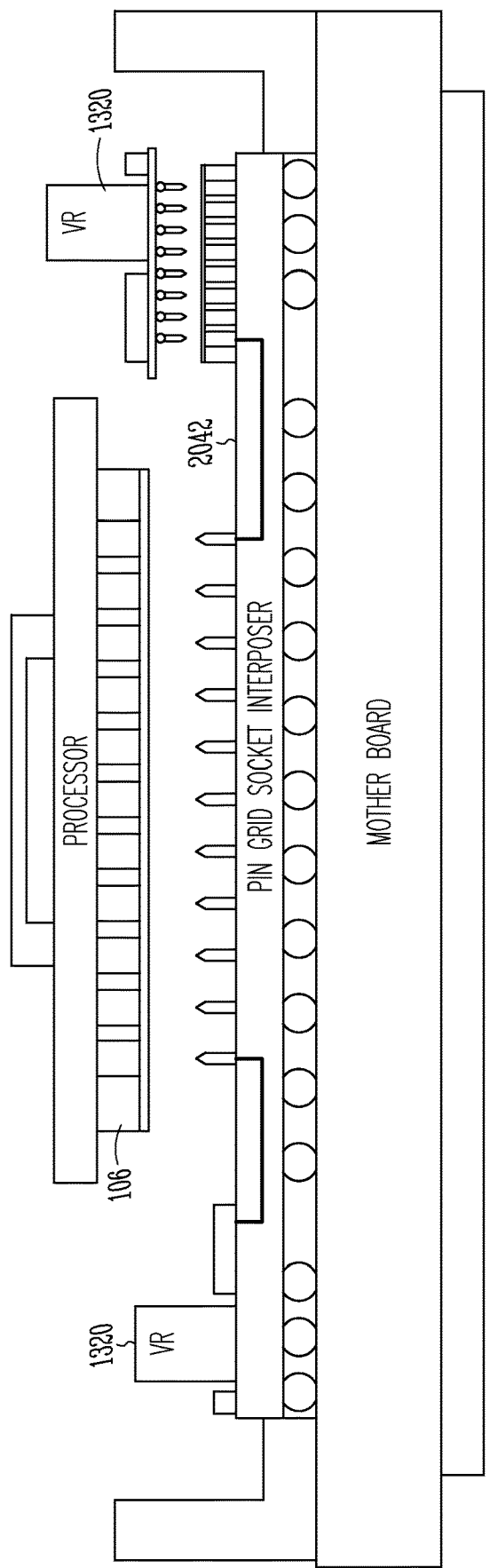
FIGS. 21-23 illustrate additional examples of a system on interposer assemblies in accordance with some example embodiments.
Figure 22:
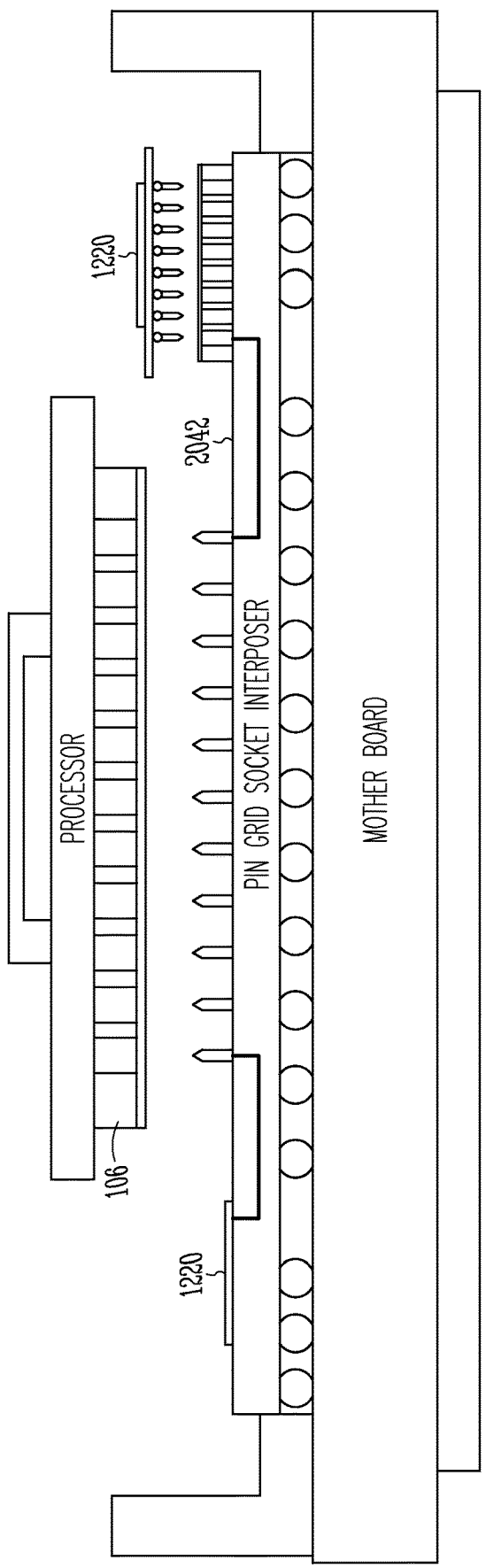

The companion component packages 220, 2020 shift processor companion functions from the mother board 2004 to the interposer 2042. Specific functions through companion components can be either permanently attached to the interposer 2042 or companion components can be attached using a separable connection. FIG. 21 is an illustration of an example of a system on interposer architecture in which the companion component packages 220, 2020 include voltage regulator circuits 1320. FIG. 22 is an illustration of an example of a system on interposer architecture in which the companion component packages 220, 2020 include one or more memory ICs 1220. In some examples, the companion component packages 220, 2020 include FPGAs. In some examples, the companion component packages 220, 2020 include near stack HSIO connections.

Figure 23:
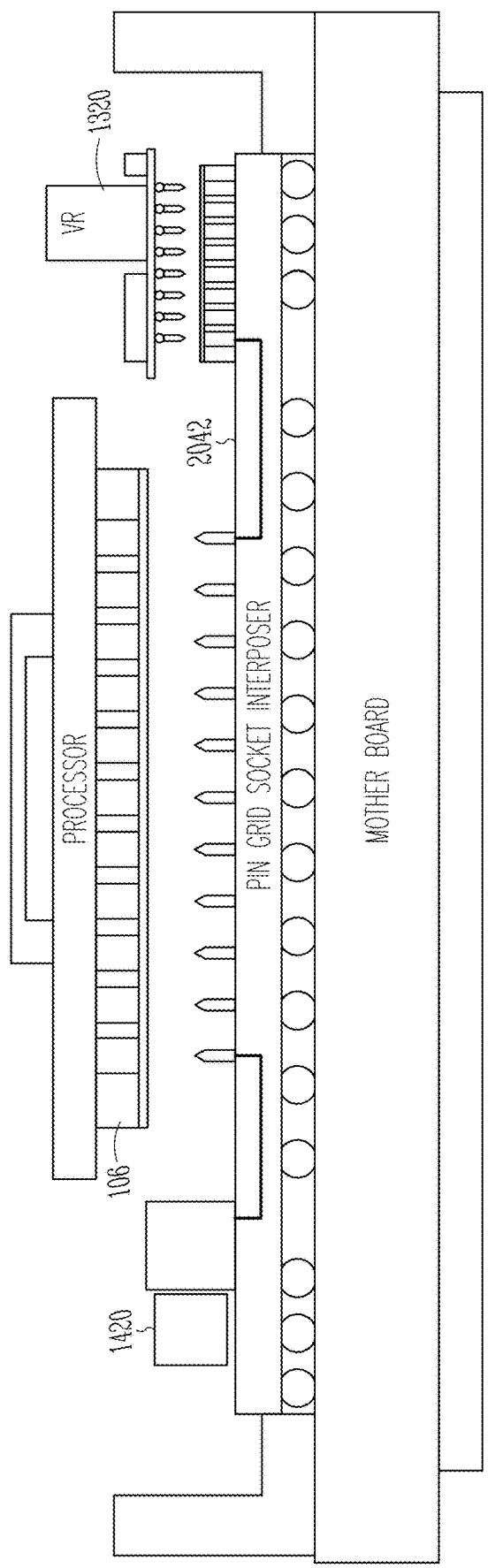

The companion component packages 220, 2020 in FIG. 20 may include different companion components. FIG. 23 is an illustration of an example of a system on interposer architecture in which companion component package 220 includes a companion voltage regulator circuit 1320 to the processor IC and companion component package 2020 includes a companion near stack HSIO connection 1420. More than two component packages can be included on the interposer 2042 and any combination of the component packages may be attached to the interposer 2042 using a liquid metal well array or permanently attached to the interposer 2042 (e.g., using solder).

This approach to a system on an interposer allows for different interconnect combinations to be used with a common mother board footprint between the pin grid socket interposer and the mother board thereby introducing different levels of performance with a single mother board. Introducing a solder hierarchy with the system on an interposer approach allows for late integration of the pin grid socket interposer and provides a plug and play architecture that allows for focused functionality from a common base platform of the mother board.

Figure 24:
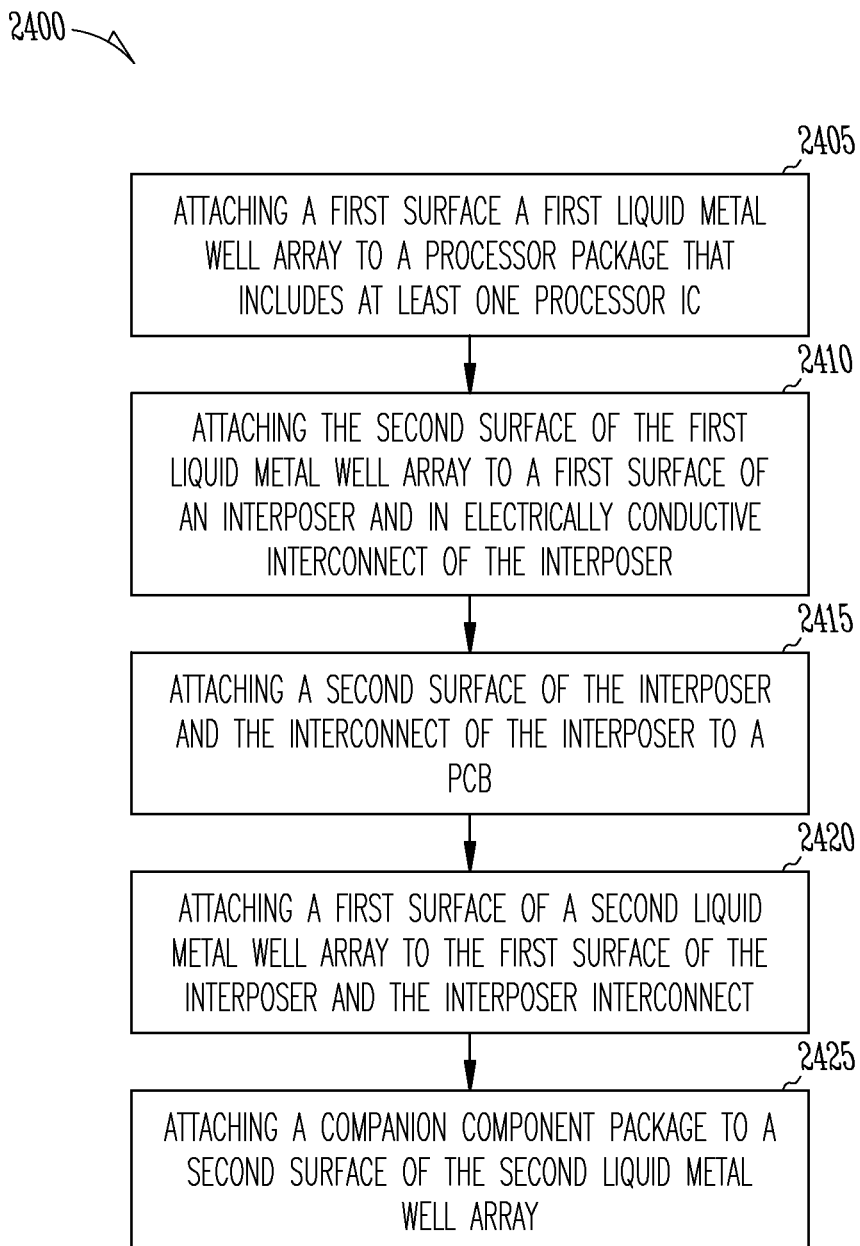
FIG. 24 is a flow diagram of another example of a method of manufacturing an electronic system having a system on interposer architecture in accordance with some example embodiments.

FIG. 24 is a flow diagram of another example of a method of making an electronic system having a system on interposer architecture. The electronic device may be any of the devices having a system on interposer assembly described herein, such as the electronic system of FIG. 20 for example. At block 2405, a top surface of a first liquid metal well array is attached to a processor package. The processor package includes at least one processor IC. The first liquid metal well array may be a two-sided first liquid metal well array. The first liquid metal well array may include a cap seal on its top surface and bottom surface to hold the liquid metal in the liquid metal wells. The processor package may include conductive pillars and the conductive pillars are attached to the liquid metal wells. The first liquid metal well array may be a one-sided first liquid metal well array that includes a cap seal on only one surface and may include contact pads on the other surface. The processor package may include contact pads and the contact pads are permanently attached to the contact pads of the first liquid metal well array.

At block 2410, the bottom surface of the first liquid metal well array is attached to a top surface of an interposer. The interposer may be a pin array socket interposer and the liquid metal wells of the first liquid metal well array are attached to the pins. The interposer includes one or more layers of electrically conductive interconnect. The first liquid metal well array provides electrical continuity between the processor package and the interposer interconnect.

At block 2415, the bottom surface of the interposer is attached to a PCB. The PCB may be a mother board. The attachment to the PCB may be a permanent attachment such as by using solder bumps. The attachment provides electrical continuity between the interposer interconnect and one or more layers of interconnect of the PCB.

At block 2420, a second liquid metal well array is attached to the top surface of the interposer. The second liquid metal well array may be a two-sided first liquid metal well array. The second liquid metal well array may include a cap seal on its top surface and bottom surface to hold the liquid metal in the liquid metal wells. Conductive pillars may be disposed on the top surface of the interposer to attach to the liquid metal wells of the second liquid metal well array. The second liquid metal well array may be a one-sided first liquid metal well array that includes a cap seal on only the top surface and may include contact pads on the bottom surface. Contact pads may be disposed on the top surface of the interposer to attach to the contact pads of the second liquid metal well array.

At block 2425, a companion component package is attached to the top surface of the second liquid metal well array. The companion component package may include conductive pillars to attach to the liquid metal wells of the second liquid metal well array. The companion component package includes a companion component to the one or more processor ICs. The second liquid metal well array is attached to the interposer connect. The interposer interconnect and liquid metal well arrays provide electrical continuity between the companion component and the one or more processor ICs of the processor package.

In certain examples, the pitch of the conductive pillars of the companion package is the same as the pitch of the processor package. In certain examples, the pitch of the conductive pillars of the companion package, the pins of the interposer, and the connection of the mother board may all be different. The pitch of the conductive pillars of the companion package may be finer than the pitch of the pins of the interposer, and the pitch of the pins of the interposer may be finer than the pitch of the connections of the mother board. Thus, the interposer provides pitch translation among the processor package, companion component packages, and the mother board.

Figure 25:
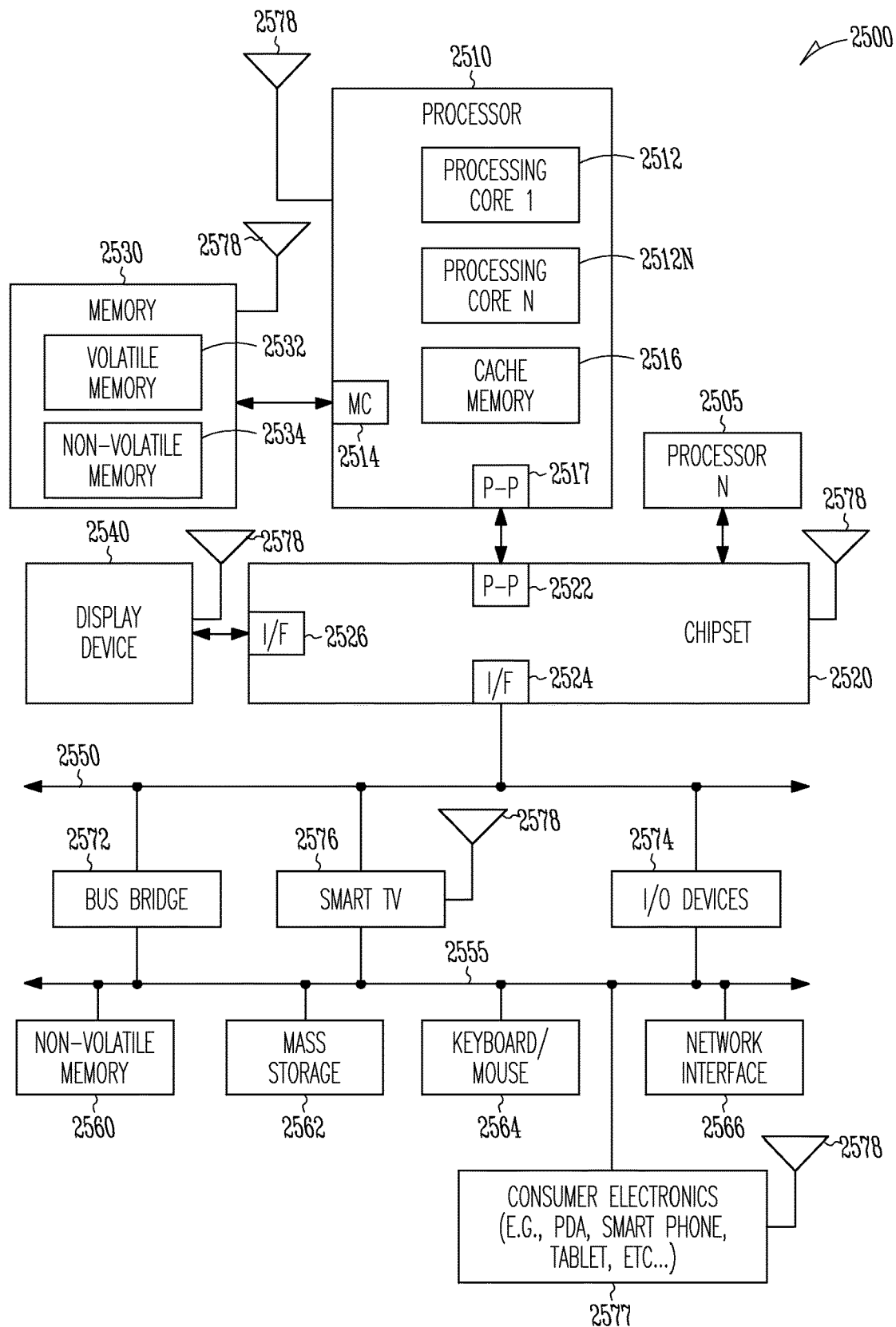
FIG. 25 shows a system that may incorporate liquid metal interconnect and methods, in accordance with some example embodiments.

FIG. 25 illustrates a system level diagram, depicting an example of an electronic device (e.g., system) that may include liquid metal interconnect LMI and/or methods described above. In one embodiment, system 2500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 2500 includes a system on a chip (SOC) system. In some embodiments, system 2500 includes a system on interposer system.

In one embodiment, processor 2510 has one or more processor cores 2512 and 2512N, where 2512N represents the Nth processor core inside processor 2510 where N is a positive integer. In one embodiment, system 2500 includes multiple processors including 2510 and 2505, where processor 2505 has logic similar or identical to the logic of processor 2510. In some embodiments, processor core 2512 includes, but is not limited to, pre-fetch logic to fetch instructions, decode logic to decode the instructions, execution logic to execute instructions and the like. In some embodiments, processor 2510 has a cache memory 2516 to cache instructions and/or data for system 2500. Cache memory 2516 may be organized into a hierarchal structure including one or more levels of cache memory.

In some embodiments, processor 2510 includes a memory controller 2514, which is operable to perform functions that enable the processor 2510 to access and communicate with memory 2530 that includes a volatile memory 2532 and/or a non-volatile memory 2534. In some embodiments, processor 610 is coupled with companion components such as memory 2530 and chipset 2520. Processor 2510 may also be coupled to a wireless antenna 2578 to communicate with any device configured to transmit and/or receive wireless signals. In one embodiment, an interface for wireless antenna 2578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 2532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 2534 includes, but is not limited to, flash memory, phase change memory (PCM), read-only memory (ROM), electrically erasable programmable read-only memory (EEPROM), or any other type of non-volatile memory device.

Memory 2530 stores information and instructions to be executed by processor 2510. In one embodiment, memory 2530 may also store temporary variables or other intermediate information while processor 2510 is executing instructions. In the illustrated embodiment, chipset 2520 connects with processor 2510 via Point-to-Point (PtP or P-P) interfaces 2517 and 2522. Chipset 2520 enables processor 2510 to connect to other elements in system 2500. In some embodiments of the example system, interfaces 2517 and 2522 operate in accordance with a PtP communication protocol such as the Intel® QuickPath Interconnect (QPI) or the like. In other embodiments, a different interconnect may be used.

In some embodiments, chipset 2520 is operable to communicate with processor 2510, 2505N, display device 2540, and other devices, including a bus bridge 2572, a smart TV 2576, I/O devices 2574, nonvolatile memory 2560, a storage medium (such as one or more mass storage devices) 2562, a keyboard/mouse 2564, a network interface 2566, and various forms of consumer electronics 2577 (such as a PDA, smart phone, tablet etc.), etc. In one embodiment, chipset 2520 couples with these devices through an interface 2524. Chipset 2520 may also be coupled to a wireless antenna 2578 to communicate with any device configured to transmit and/or receive wireless signals. In one example, any combination of components in a chipset may be separated by a continuous flexible shield as described in the present disclosure.

Chipset 2520 connects to display device 2540 via interface 2526. Display 2540 may be, for example, a liquid crystal display (LCD), a light emitting diode (LED) array, an organic light emitting diode (OLED) array, or any other form of visual display device. In some embodiments of the example system, processor 2510 and chipset 2520 are merged into a single SOC. In addition, chipset 2520 connects to one or more buses 2550 and 2555 that interconnect various system elements, such as I/O devices 2574, non-volatile memory 2560, storage medium 2562, a keyboard/mouse 2564, and network interface 2566. Buses 2550 and 2555 may be interconnected together via a bus bridge 2572.

In one embodiment, mass storage device 2562 includes, but is not limited to, a solid state drive, a hard disk drive, a universal serial bus flash memory drive, or any other form of computer data storage medium. In one embodiment, network interface 2566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 25 are depicted as separate blocks within the system 2500, the functions performed by some of these blocks may be integrated within a single semiconductor circuit or may be implemented using two or more separate integrated circuits. For example, although cache memory 2516 is depicted as a separate block within processor 2510, cache memory 2516 (or selected aspects of 2516) can be incorporated into processor core 2512.

To better illustrate the method and apparatuses disclosed herein, a non-limiting list of embodiments is provided here:

Example 1 includes subject matter (such as an electronic system) comprising an interposer including electrically conductive interposer interconnect, a first interposer surface, and a second interposer surface; a processor package including at least one processor integrated circuit (IC), the processor package attached to the first interposer surface and electrically connected to the interposer interconnect; a first liquid metal well array including multiple liquid metal wells attached to the second interposer surface and the interposer interconnect; a second liquid metal well array including a first array surface attached to the first interposer surface and the interposer interconnect; and a companion component package attached to a second array surface of the second liquid metal well array, wherein the companion component package includes a companion component to the processor IC.

In Example 2, the subject matter or Example 1 optionally includes a mother board including mother board interconnect; and wherein a pitch of the first liquid metal well array matches a pitch of the mother board interconnect and a pitch of the second liquid metal well array is a finer pitch than the pitch of the first liquid metal well array.

In Example 3, the subject matter of one or both of Examples 1 and 2 optionally includes the liquid metal wells of the second liquid metal well array a attached to conductive pillars on the first interposer surface and to conductive pillars of the companion component package.

In Example 4, the subject matter on one or any combination of Examples 1-3 optionally includes the second liquid metal well array including solid metal contact pads on the first array surface attached to the first interposer surface using solder bumps; and the liquid metal wells of the second liquid metal well array attached to conductive pillars of the companion component package at the second array surface of the second liquid metal well array.

In Example 5, the subject matter of one or any combination of Examples 1-4 optionally includes the companion component package including a memory IC.

In Example 6, the subject matter of one or any combination of Examples 1-5 optionally includes the companion component package including a field programmable gate array (FPGA).

In Example 7, the subject matter of one or any combination of Examples 1-6 optionally includes the companion component package including voltage regulator IC.

In Example 8, the subject matter of one or any combination of Examples 1-7 optionally includes the companion component package including at least one circuit component of a voltage regulator circuit.

In Example 9, the subject matter of one or any combination of Examples 1-8 optionally includes the companion component package including a high-speed input-output (HSIO) connector.

In Example 10, the subject matter of one or any combination of Examples 1-9 optionally includes multiple liquid metal well arrays attached to the first interposer surface, wherein the multiple liquid metal well arrays attached to the first interposer surface have a finer pitch than the first liquid metal well array attached to the second interposer surface; and multiple companion component packages attached to the multiple liquid metal well arrays attached to the first interposer surface.

In Example 11, the subject matter of one or any combination of Examples 1-10 optionally includes a pin grid socket attached to the first liquid metal well array on a first side of the pin grid socket and attached to a printed circuit board (PCB) on a second side of the pin grid socket; and wherein a pitch of the first liquid metal well array matches a pin pitch of the pin grid socket and a pitch of the second liquid metal well array is a finer pitch than the pitch of the first liquid metal well array.

In Example 12, the subject matter of one or any combination of Examples 1-11 optionally includes multiple pin grid sockets, each pin grid socket attached to a portion of the multiple liquid metal wells of the first liquid metal well array on a first side of the pin grid socket and attached to a printed circuit board (PCB) on a second side of the pin grid socket.

Example 13 includes subject matter (such as a method of forming an electronic device) or can optionally be combined with one or any combination of Examples 1-12 to include such subject matter, comprising placing a processor package on a first interposer surface of an interposer, the interposer including electrically conductive interposer interconnect and the processor package electrically connected to the interposer interconnect, attaching a first surface of a first liquid metal well array to a second interposer surface and the interposer interconnect, attaching a first array surface of a second liquid metal well array to the first interposer surface and the interposer interconnect, and attaching a companion component package to a second array surface of the second liquid metal well array. The companion component package includes a companion component to a processor of the processor package.

In Example 14, the subject matter of Example 13 optionally includes attaching the first liquid metal well array to a mother board, and a pitch of the first liquid metal well array matches a pitch of the mother board interconnect and a pitch of the second liquid metal well array is a finer pitch than the pitch of the first liquid metal well array.

In Example 15, the subject matter of one or both of Examples 13 and 14 optionally includes disposing conductive pillars on the first interposer, wherein the conductive pillars are electrically connected to the interposer interconnect, and attaching the liquid metal wells of the second liquid metal array to the conductive pillars on the first interposer surface.

In Example 16, the subject matter of one or any combination of Examples 13-15 optionally includes disposing contact pads on the first interposer surface, wherein the contact pads are electrically connected to the interposer interconnect, and attaching the first array surface of the second liquid metal array to the contact pads on the first interposer surface.

Example 17 includes subject matter (such as an electronic system) or can optionally be combined with one or any combination of Examples 1-16 to include such subject matter, comprising a first interposer including electrically conductive interposer interconnect; a first processor package including at least one processor integrated circuit (IC), the processor package attached to a first surface of the first interposer and connected to the first interposer interconnect; a first liquid metal well array including multiple liquid metal wells attached to a second surface of the first interposer and connected to the first interposer interconnect; a second interposer including electrically conductive interconnect; an IC package attached to a first surface of the second interposer and connected to the second interposer interconnect; a second liquid metal well array including multiple liquid metal wells attached to a second surface of the second interposer and connected to the second interposer interconnect; and the first liquid metal well array attached to the second surface of the second interposer and connected to the second interposer interconnect, and the second liquid metal well array attached to the second surface of the first interposer and connected to the first interposer interconnect.

In Example 18, the subject matter of Example 17 optionally includes the first and second interposers being first and second mother boards.

In Example 19, the subject matter of one or both of Examples 17 and 18 optionally includes a companion component to the processor IC attached to the first surface of the first interposer and connected to the first interposer interconnect.

In Example 20, the subject matter of one or any combination of Examples 17-19 optionally includes the IC package of the second interposer being a second processor package including a second processor IC, and the second interposer including a companion component to the second processor IC attached to the first surface of the second interposer and connected to the second interposer interconnect.

In Example 21, the subject matter on one or any combination of Examples 17-20 optionally includes the multiple liquid metal wells of the first and second liquid metal well arrays being two sided liquid metal wells.

In Example 22, the subject matter of one or any combination of Examples 17-21 optionally includes the multiple liquid metal wells of the first and second liquid metal well arrays being one sided liquid metal wells; a first surface of the first liquid metal well array attached to the second surface of the first interposer using solder bumps and the multiple liquid metal wells of the first liquid metal well array are attached to conductive pillars of the second surface of the second interposer; and a first surface of the second liquid metal well array attached to the second surface of the first interposer using solder bumps and the multiple liquid metal wells of the second liquid metal well array attached to conductive pillars of the second surface of the first interposer. These non-limiting Examples can be combined in any permutation or combination.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The invention claimed is:

1. An electronic system, comprising:
   a first interposer comprising an electrically conductive first interposer interconnect;
   a processor package comprising at least one processor integrated circuit (IC), the processor package attached to a first surface of the first interposer and connected to the first interposer interconnect;
   a first liquid metal well array comprising multiple liquid metal wells attached to a second surface of the first interposer and connected to the first interposer interconnect;
   a second interposer comprising an electrically conductive second interposer interconnect;
   an IC package attached to a first surface of the second interposer and connected to the second interposer interconnect; and
   a second liquid metal well array comprising multiple liquid metal wells attached to a second surface of the second interposer and connected to the second interposer interconnect,
   wherein the first liquid metal well array is attached to the second surface of the second interposer and connected to the second interposer interconnect, and the second liquid metal well array is attached to the second surface of the first interposer and connected to the first interposer interconnect.

2. The electronic system of claim 1, wherein the first and second interposers are first and second mother boards.

3. The electronic system of claim 1, comprising a companion component to the processor IC attached to the first surface of the first interposer and connected to the first interposer interconnect.

4. The electronic system of claim 3, wherein the companion component comprises one of a memory IC, a field programmable gate array (FPGA), a voltage regulator IC, at least one circuit component of a voltage regulator circuit, or a circuit package that includes a high-speed input-output (HSIO) connector.

5. The electronic system of claim 1, wherein the multiple liquid metal wells of the first and second liquid metal well arrays are two-sided liquid metal wells.

6. The electronic system of claim 1, wherein the multiple liquid metal wells of the first and second liquid metal well arrays are one-sided liquid metal wells.

7. The electronic system of claim 6, wherein a first surface of the first liquid metal well array is attached to the second surface of the first interposer using solder bumps and the multiple liquid metal wells of the first liquid metal well array are attached to conductive pillars of the second surface of the second interposer.

8. The electronic system of claim 7, wherein a first surface of the second liquid metal well array is attached to the second surface of the first interposer using solder bumps and the multiple liquid metal wells of the second liquid metal well array are attached to conductive pillars of the second surface of the first interposer.

9. The electronic system of claim 1, wherein the IC package of the second interposer is a second processor package comprising a second processor IC.

10. The electronic system of claim 9, wherein the second interposer comprises a companion component to the second processor IC attached to the first surface of the second interposer and connected to the second interposer interconnect.

11. The electronic system of claim 10, wherein the companion component comprises system memory.

12. An apparatus, comprising:
    a first interposer comprising a first interposer interconnect;
    a processor package attached to a first surface of the first interposer and connected to the first interposer interconnect;
    a first liquid metal well array attached to a second surface of the first interposer and connected to the first interposer interconnect;
    a second interposer comprising a second interposer interconnect;
    an integrated circuit (IC) package attached to a first surface of the second interposer and connected to the second interposer interconnect; and
    a second liquid metal well array attached to a second surface of the second interposer and connected to the second interposer interconnect, wherein the first liquid metal well array is attached to the second surface of the second interposer and connected to the second interposer interconnect, and the second liquid metal well array is attached to the second surface of the first interposer and connected to the first interposer interconnect.

13. The apparatus of claim 12, wherein the first and second interposers are first and second mother boards.

14. The apparatus of claim 12, comprising a companion component to the processor package attached to the first surface of the first interposer and connected to the first interposer interconnect.

15. The apparatus of claim 14, wherein the companion component comprises one of a memory IC, a field programmable gate array (FPGA), a voltage regulator IC, at least one circuit component of a voltage regulator circuit, or a circuit package that includes a high-speed input-output (HSIO) connector.

16. The apparatus of claim 12, wherein the first and second liquid metal well arrays comprise multiple two-sided liquid metal wells.

17. The apparatus of claim 12, wherein the first and second liquid metal well arrays comprise multiple one-sided liquid metal wells.

18. The apparatus of claim 17, wherein a first surface of the first liquid metal well array is attached to the second surface of the first interposer using solder bumps and the multiple one-sided liquid metal wells of the first liquid metal well array are attached to conductive pillars of the second surface of the second interposer.

19. The apparatus of claim 18, wherein a first surface of the second liquid metal well array is attached to the second surface of the first interposer using solder bumps and the multiple one-sided liquid metal wells of the second liquid metal well array are attached to conductive pillars of the second surface of the first interposer.

20. The apparatus of claim 12, wherein the IC package of the second interposer is a second processor package.

21. The apparatus of claim 20, wherein the second interposer comprises a companion component to the second processor package attached to the first surface of the second interposer and connected to the second interposer interconnect.

22. The apparatus of claim 21, wherein the companion component comprises system memory.

* * * * *